United States Patent
Hashimoto et al.

(10) Patent No.: US 7,476,841 B2
(45) Date of Patent: Jan. 13, 2009

(54) PHOTODETECTOR, SPATIAL INFORMATION DETECTING DEVICE USING THE PHOTODETECTOR, AND PHOTO DETECTION METHOD

(75) Inventors: Yusuke Hashimoto, Neyagawa (JP); Yuji Takada, Kyoto (JP)

(73) Assignee: Matsushita Electric Works, Ltd., Osaka (JP)

( * ) Notice: Subject to any disclaimer, the term of this patent is extended or adjusted under 35 U.S.C. 154(b) by 30 days.

(21) Appl. No.: 11/722,110

(22) PCT Filed: Dec. 28, 2005

(86) PCT No.: PCT/JP2005/024109

§ 371 (c)(1),
(2), (4) Date: Jun. 19, 2007

(87) PCT Pub. No.: WO2006/073120

PCT Pub. Date: Jul. 13, 2006

(65) Prior Publication Data

US 2008/0029690 A1 Feb. 7, 2008

(30) Foreign Application Priority Data

Jan. 5, 2005 (JP) .............................. 2005-001003
Jan. 6, 2005 (JP) .............................. 2005-001950

(51) Int. Cl.
*H01L 27/00* (2006.01)

(52) U.S. Cl. .................. 250/214.1; 250/208.1; 257/448; 348/297

(58) Field of Classification Search .............. 250/208.1, 250/214.1, 370.01, 370.08; 257/431, 445, 257/448; 348/294, 297
See application file for complete search history.

(56) References Cited

U.S. PATENT DOCUMENTS 5,665,960 A  9/1997  Machida et al.
5,841,180 A  11/1998  Kobayashi et al.

(Continued)

FOREIGN PATENT DOCUMENTS

JP          62 272773         11/1987

(Continued)

OTHER PUBLICATIONS

English language Abstract of JP 62-272773.

(Continued)

*Primary Examiner*—Kevin Pyo
(74) *Attorney, Agent, or Firm*—Greenblum & Bernstein, P.L.C.

(57) ABSTRACT

A photodetector is provided, which has the capability of preventing a reduction in dynamic range for a signal light even under a plenty of environmental light to stably obtain a received light output. This photodetector has an accumulation electrode and a holding electrode, which are formed on a photoelectric converting portion through an insulating layer, and a control unit for controlling timings of applying voltages to these electrodes and polarities of the voltages. One of electrons and holes generated in the photoelectric converting portion is accumulated in an accumulation region formed by applying the voltage to the accumulation electrode, and the other is accumulated in a holding region formed by applying the voltage to the holding electrode. Then, the electrons and holes accumulated in the accumulation region and the holding region are recombined, so that remaining electrons or holes not recombined are output.

20 Claims, 10 Drawing Sheets

U.S. PATENT DOCUMENTS

2001/0024844 A1* 9/2001 Kobayashi et al. .......... 438/155
2004/0051801 A1  3/2004 Iizuka et al.
2007/0076108 A1* 4/2007 Misawa ...................... 348/294

FOREIGN PATENT DOCUMENTS

| JP | 8 264744 | 10/1996 |
| JP | 9 260718 | 10/1997 |
| JP | 2001 337166 | 12/2001 |
| JP | 2004 111590 | 4/2004 |

OTHER PUBLICATIONS

English language Abstract of JP 2001-337166.

* cited by examiner

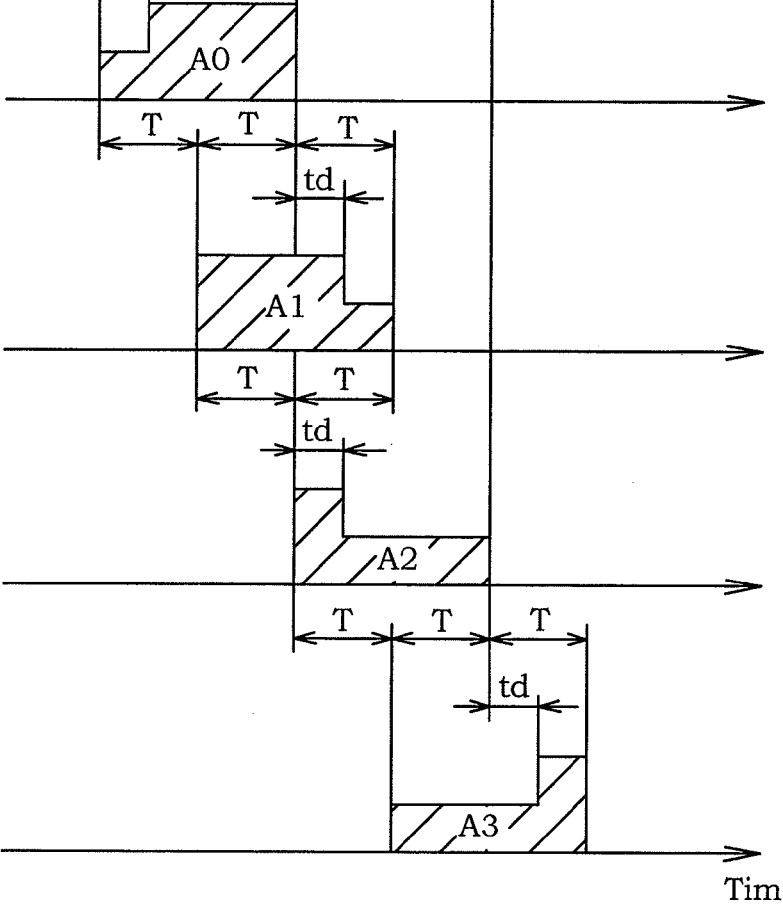

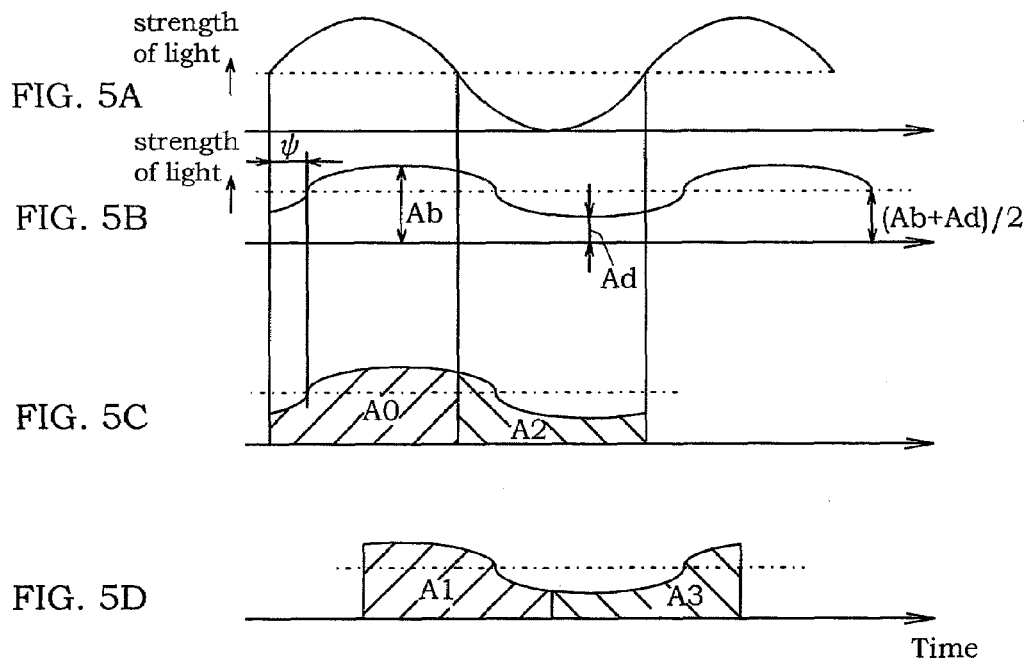
FIG. 5A
FIG. 5B
FIG. 5C
FIG. 5D
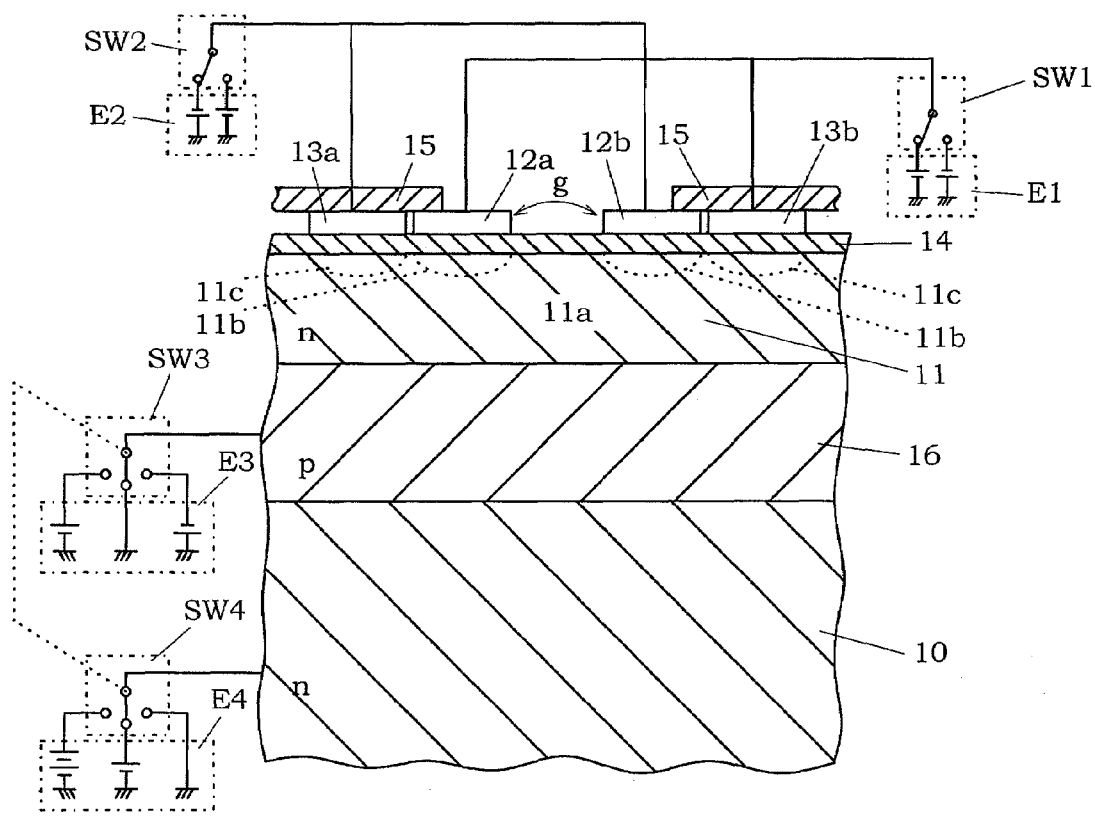
FIG. 6

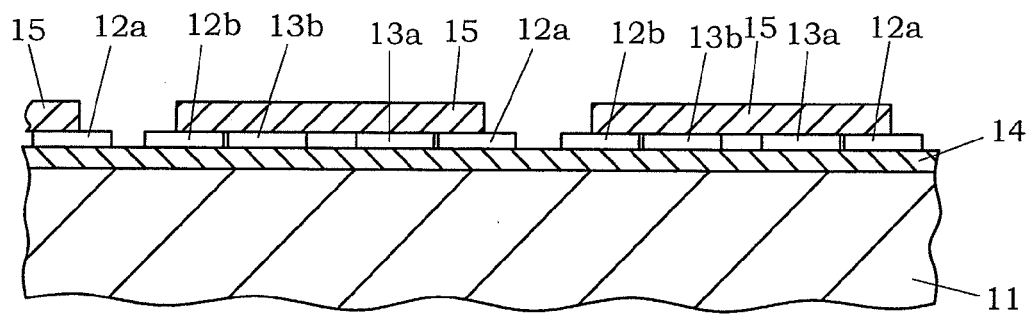
FIG. 7
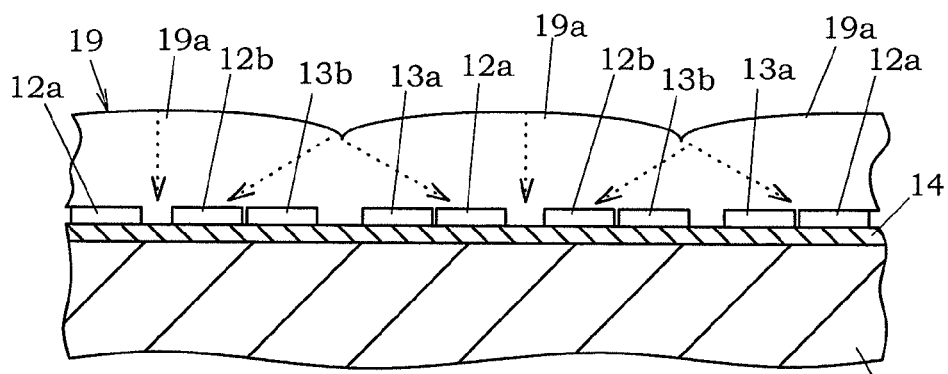
FIG. 8
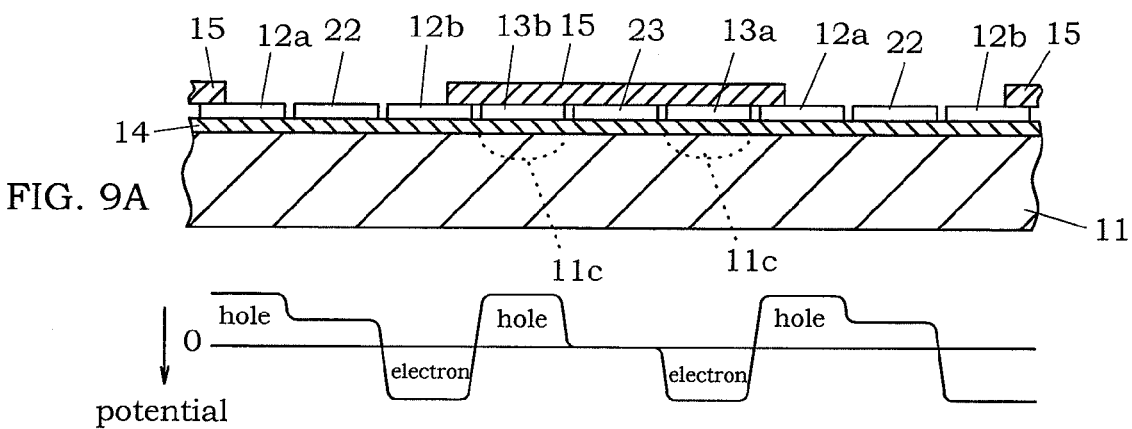
FIG. 9A
FIG. 9B

PHOTODETECTOR, SPATIAL INFORMATION DETECTING DEVICE USING THE PHOTODETECTOR, AND PHOTO DETECTION METHOD

TECHNICAL FIELD

The present invention relates to a technology of stably obtaining a received light output for a signal light as an object of detection, even under a plenty of environmental light such as natural light from the sun and indoor illumination light.

BACKGROUND ART

In the past, various kinds of photodetectors such as photodiode, phototransistor, and CCD image sensor have been known, and widely used in the applications of photoelectric sensor for detecting the presence or absence of an object according to a change in received light amount, optical communication using light as the transmission medium, distance sensor for optically measuring distance by using the principal of triangulation, or the time difference or the phase difference between projected and received lights, and image pickup device for video and digital cameras.

In this kind of photodetector, when the received light amount is within an appropriate range, a received light output with a magnitude corresponding to the received light amount can be obtained. However, when the received light amount becomes excess, there is a problem that the received light output is saturated. For example, under the condition that there is environmental light such as sunlight, when using the photodetector for the photoelectric sensor for detecting intruders, the optical communication device such as optical remote control units, the distance sensor for autofocus cameras and robot's eyes, and the image pickup device used in cooperation with a light emitting source to obtain a distance image, the environmental light other than light irradiated from the light emitting source is incident on the photodetector, so that the received light amount increases, as compared with the case of receiving only the light irradiated from the light emitting source. However, there is a limitation with respect to amounts of carriers that the photodetector can generate. Therefore, when the received light amount excessively increases, the generation amounts of the carriers will be saturated. Consequently, a dynamic range of the photodetector reduces depending on the light amount of environmental light. This leads to an inconvenience that the received light output for signal light cannot be stably obtained. This problem is also known as a "blooming effect" in the field of the CCD image sensor.

To improve the above problem, for example, Japanese Patent Early Publication No. 62-272773 proposes that a large positive voltage is applied to an electrode formed on a p-type silicon substrate through an insulating layer to place a potential well at a reversed state, so that large amounts of carriers collected at an interface with the insulating layer are recombined with excessive amounts of carriers to control small amounts of carriers accumulated under the electrode to be not greater than predetermined amounts. However, according to this method, the excessive amounts of carriers generated by receiving light are recombined by using electric charges supplied from an external circuit for providing a reference potential of the substrate, i.e., large amounts of carriers (when using a p-type substrate, the carriers are holes, and when using an n-type substrate, the carriers are electrons) previously filled in the substrate. In addition, it is essential to change an operation frequency for recombining surface charges in accordance with exposure time. Therefore, there is a problem that the control becomes complex to obtain a received light output within an appropriate range by suppressing the dynamic range of the received light amount.

On the other hand, when a signal light and environmental light are mixed, variations in environmental light makes difficult to separate the signal light from the environmental light. As a technology of separating the signal light from the environmental light, it is proposed to use an optical filter for passing only the signal light having a specific wavelength. However, since the environmental light such as sunlight has a wide spectrum range, the influence of the environmental light cannot be sufficiently removed by only the optical filter.

To improve the above problem, for example, Japanese Patent Early Publication No. 2001-337166 proposes that a received light output obtained by a photodetector in an extinction period, which is a period where a signal light is not obtained, and light is not radiated from a light emitting source, is used as a component corresponding to only the environmental light, and a received light output obtained by the photodetector in a lighting period, which is a period where the signal light is obtained, and the light is radiated from the light emitting source, is used as a superimposed component of the signal light and the environmental light. In this case, a component corresponding to only the signal light can be extracted by subtracting the received light output of the photodetector in the extinction period from the received light output of the photodetector in the lighting period. However, a dynamic range for the signal light of the photodetector decreases in the presence of the environmental light. When the photodetector is saturated, there is still a problem that a large received light output cannot be extracted with respect to the signal light. In brief, in the presence of the environmental light, even when the light amount emitted from the light emitting source is increased, or the light receiving time of the photodetector is extended, it is difficult to obtain a sufficiently large S/N ratio due to a reduction in dynamic range for the signal light of the photodetector.

SUMMARY OF THE INVENTION

Therefore, a primary concern of the present invention is to provide a photodetector, which has advantages that the recombination probability of carriers is determined according to a received light amount, and saturation caused by environmental light is prevented to suppress a reduction in dynamic range for a signal light, so that a received light output for the signal light is stably obtained.

That is, the photodetector of the present invention comprises:

a photoelectric converting portion configured to generate electrons and holes by irradiation of light;

at least one electrode disposed on the photoelectric converting portion through an insulating layer;

a first accumulation region, which is a potential well formed in the photoelectric converting portion by applying a voltage to the electrode to accumulate one of the electrons and holes generated in the photoelectric converting portion by irradiation of light;

a second accumulation region formed in the photoelectric converting portion to accumulate the other of the electrons and holes generated in the photoelectric converting portion by irradiation of light;

a control unit configured to control at least one of a timing of applying the voltage to the electrode and a polarity of the voltage; and an output unit configured to output at least one of remaining electrons and holes not recombined after the electrons and holes accumulated in the first and second accumulation regions are recombined by transferring the electrons and holes between the first and second accumulation regions.

In the above photodetector, it is preferred that the at least one electrode is a pair of first and second electrodes disposed on the photoelectric converting portion through the insulating layer, and the control unit applies a voltage to the first electrode to form the first accumulation region, and applies a voltage to the second electrode to form a potential well as the second accumulation region. In this case, it is particularly preferred that the control unit controls timings of applying the voltages to the first and second electrodes and polarities of the voltages such that one of the electrons and holes generated in the photoelectric converting portion by irradiation of light are accumulated in the first accumulation region, and the other of the electrons and holes generated at a different time in the photoelectric converting portion by irradiation of light are accumulated in the second accumulation region.

In this configuration, the first electrode (i.e., "accumulation electrode" in the embodiments described later) and the second electrode (i.e., "holding electrode" in the embodiments described later) are formed with respect to one photoelectric converting portion, so that two potential wells can be formed as the first accumulation region (i.e., "accumulation region" in the embodiments described later) and the second accumulation region (i.e., "holding region" in the embodiments described later) in the photoelectric converting portion. For example, when a light emitting source is used in cooperation with the photodetector, electrons are accumulated in the first accumulation region in a period of receiving a signal light and environmental light, and then the accumulated electrons are transferred and held in the second accumulation region. At this time, parts of the electrons are stably captured by dangling bonds or an interfacial potential at an interface portion between the insulating layer and the first accumulation region. Therefore, in fact, parts of the electrons remain in the first accumulation region, and the balance of the electrons are transferred and held in the second accumulation region. Next, holes are accumulated in the first accumulation region in a period of receiving only the environmental light. At this time, parts of the holes that come in the first accumulation region are used to recombine with the electrons captured at the interface portion between the insulating layer and the first accumulation region, and they disappear. Subsequently, when the electrons and holes are mutually transferred between the first accumulation region and the second accumulation region, the recombination of the holes and the electrons accumulated in the first and second accumulation regions happens. It is thought that the probability that the recombination happens in the first and second accumulation regions is higher than the probability that the recombination happens in the process of transferring. Thus, by recombining the electrons accumulated in the period of receiving the signal light and environmental light with the holes accumulated in the period of receiving only the environmental light, it becomes possible to offset the environmental-light component. That is, the environmental-light component is offset by the recombination performed by use of the carriers (electrons and holes) generated by receiving light, but not the recombination performed by use of the carriers previously filled in the substrate. As a result, saturation of the photodetector becomes hard to occur, and it is possible to suppress a reduction in dynamic range for the signal light of the photodetector.

In addition, when the environmental-light component is offset by the recombination of electrons and holes at the time of receiving the signal light and the environmental light, the saturation of the photodetector is hard to occur, and the reduction in dynamic range for the signal light of the photodetector can be more effectively suppressed, as compared with the case where each of a received light output obtained by receiving the signal light and the environmental light and a received light output obtained by receiving only the environmental light is taken out from the photodetector, and then a difference between these two received light outputs is operated.

In addition, it is preferred that the control unit applies voltages with opposite polarities to the first and second electrodes (i.e., "distribution electrodes" in the sixth embodiment described later) such that one of the electrons and holes generated in the photoelectric converting portion by irradiation of light are accumulated in the first accumulation region, and simultaneously the other of the electrons and holes are accumulated in the second accumulation region. In this case, since the voltage applied to the first electrode has a reverse polarity with respect to the voltage applied to the second electrode, the electrons and holes generated in the photoelectric converting portion are separately sent and accumulated in the potential wells of the first and second accumulation regions, and then the recombination is performed by transferring the electrons and holes between the first and second accumulation regions. Therefore, as in the case described above, the environmental-light component can be offset by the recombination of the electrons and holes. As a result, the saturation of the photodetector becomes hard to occur, and the reduction in dynamic range for the signal light of the photodetector can be suppressed. In addition, since amounts of carriers concerning the recombination change depending on the received light amount, there is a further effect of suppressing or compressing a fluctuation width of the received light amount without an external control.

In a conventional photodetector such as CCD image pickup device, it has been known that a fluctuation (shot noise) of output level (received-light output level) of each pixel occurs due to the occurrence probability (the occurrence number) of electrons and holes generated by irradiation of light. To reduce the influence of the shot noise, the carriers (electrons or holes) are integrated to obtain the received light output. However, as the integration time is extended, the response speed becomes slower in place of reducing the influence of the shot noise. On the other hand, according to the present invention, since the recombination probability becomes lower as the occurrence number of electrons and holes decreases, the recombination probability varies in a direction of suppressing the fluctuation of the received light output. Consequently, there is an advantage of reducing the shot noise.

In addition, it is preferred that the photodetector has a light shielding film on the second electrode. In this case, the control unit controls timings of applying the voltages to the first and second electrodes and polarities of the voltages such that after one of electrons and holes are accumulated in the first accumulation region, they are transferred and held in the second accumulation region, and the other of electrons and holes are accumulated in the first accumulation region. Since the second accumulation region corresponding to the second electrode is light-shielded, it is possible prevent that the electrons and holes generated in the photoelectric converting portion are directly accumulated in the second accumulation region. In addition, it is possible to prevent that an error of electric charge amounts (i.e., an error of the received light output) is caused by mixing the carriers from the photoelectric converting portion into the carriers held in the second accumulation region. This effect can be also achieved by disposing a lens for allowing an incident light to converge on the first electrode. When using the lens, there is another advantage that an aperture ratio is increased (i.e., sensitivity is improved) by converging the incident light.

In the above photodetector, it is preferred that the first electrode is provided by a pair of first electrodes, the second electrode is provided by a pair of second electrodes, transfer electrodes are formed on the photoelectric converting portion through the insulating layer between the first electrodes and between the second electrodes, and the control unit controls voltages applied to the first electrodes, the second electrodes, and the transfer electrodes such that at least one of the remaining electrons and holes are transferred to the output unit. In this case, separation between the electrons and holes generated in the photoelectric converting portion becomes easy by relatively increasing a distance between adjacent accumulation electrodes. In addition, a potential well is formed in the photoelectric converting portion by use of the transfer electrodes to take out the received light output. Therefore, there is an advantage that the carriers (electrons or holes) providing the received light output can be easily transferred. Moreover, by controlling the voltages applied to the transfer electrodes, it is possible to regulate an accumulation efficiency of electrons or holes.

In addition, when the first electrode is provided by a pair of first electrodes, and the second electrode is provided by a pair of second electrodes, it is preferred that at least one control electrode is formed on the photoelectric converting portion through the insulating layer between the first electrodes and/or between the second electrodes, and the control unit applies a voltage to the control electrode to form an evacuation region of a potential well, so that electrons and holes are transferred between the first accumulation region and the second accumulation region via the evacuation region. It is particularly preferred that the control unit controls voltages applied to the first electrodes, the second electrodes and the control electrode such that a potential gradient occurs in a certain direction among the first accumulation region, the second accumulation region and the evacuation region. According to this configuration, even when a period occurs in which electrons or holes can not held in the potential well of the first accumulation region (accumulation region) or the second accumulation region (holding region), the electrons or the holes are temporarily held in the evacuation region during such a period. Therefore, it is possible to prevent diffusion of the electrons or the holes.

In addition, it is preferred that the photoelectric converting portion is provided with a substrate, an intermediate layer formed on the substrate, and a main function layer formed on the intermediate layer, the control unit controls a polarity of a reset voltage such that the rest voltage applied to the intermediate layer is a reverse bias with respect to a substrate voltage applied to the substrate, in order to discard electrons and holes remaining in the photoelectric converting portion via one of the substrate and the intermediate layer. In this case, it is possible to discard both of electrons and holes of unwanted carriers remaining in the photoelectric converting portion, and therefore suppress an error of the received light output taken out from the photoelectric converting portion.

A further object of the present invention is to provide a spatial information detecting device using the photodetector described above. This spatial information detecting device is characterized by comprising:

a light projecting unit configured to irradiate a light intensity-modulated by a modulation signal having a predetermined frequency to a target space;

the photodetector, the photoelectric converting portion of the photodetector generating electrons and holes by receiving the light from the target space, the control unit of the photodetector switching between a state of applying voltages to the first and second electrodes such that electrons are accumulated in the first accumulation region, and holes are accumulated in the second accumulation region, and a state of applying voltages to the first and second electrodes such that holes are accumulated in the first accumulation region, and electrons are accumulated in the second accumulation region, thereby recombining the electrons and holes between the first and second accumulation regions, and the output unit outputting at least one of remaining electrons and holes not recombined; and an evaluation unit configured to evaluate the target space according to an output of the photodetector.

According to this device, when the timing of accumulating the electric charges in the first accumulation region is determined by two periods with different strengths of the signal light, a received light output provides a difference between received light amounts corresponding to the two periods. Therefore, it is possible to obtain the received light output corresponding to a change in the signal light between the two periods. In brief, since it is not needed to operate the difference at the outside of the photodetector, there is an advantage that the evaluation unit can be simplified in the case where the difference is needed to obtain the information of the target space. As the spatial information to be detected, for example, there are a distance to an object in the target space, a reflectance of the object in the target space, and a transmittance of a medium in the target space.

In the spatial information detecting device described above, it is preferred that the control unit alternately switches every 180 degrees in phase of the modification signal between the state of applying the voltages to the first and second electrodes such that electrons are accumulated in the first accumulation region, and holes are accumulated in the second accumulation region, and the state of applying the voltages to the first and second electrodes such that holes are accumulated in the first accumulation region, and electrons are accumulated in the second accumulation region, thereby recombining the electrons and holes between the first and second accumulation regions, and the evaluation unit determines a difference between an output provided by one of electrons and holes remaining in the first accumulation region after the recombination and an output provided by the other of electrons and holes remaining in the second accumulation region after the recombination with respect to each of two sections, which are different in phase of the modulation signal, and then evaluate the target space from the differences determined with respect to the two sections. In addition, it is preferred that the evaluation unit comprises a distance operating unit configured to convert a value, which is obtained by dividing the difference determined in one of the two sections by the difference determined in the other section, into a distance. According to these configurations, since the difference between the received light outputs obtained in the states that are different in phase by 180 degrees is used, and the value obtained by dividing the difference determined in one of the two sections that are different in phase by 90 degrees by the difference determined in the other section is converted into the distance, it is possible to cancel a difference between accumulation efficiencies of electrons and holes in the accumulation region and the recombination probability of electrons and holes, and therefore accurately determine the distance by formula calculation, as explained in detail below.

The present invention further provides a photodetector comprising:

a photoelectric converting portion configured to generate electrons and holes by irradiation of light;

an electrode disposed on the photoelectric converting portion through an insulating layer;

a charge accumulation region that is a potential well formed in the photoelectric converting portion by applying a voltage to the electrode;

a control unit configured to control a timing of applying the voltage to the electrode and a polarity of the voltage such that one of the electrons and holes generated in the photoelectric converting portion by irradiation of light are held at an interface portion between the photoelectric converting portion and the insulating layer in the charge accumulation region, and then the other of the electrons and holes generated in the photoelectric converting portion by irradiation of light are accumulated in the charge accumulation region, thereby recombining the electrons and holes at the interface portion; and an output unit configured to output at least one of remaining electrons and holes not recombined after the recombination.

According to this photodetector, since the electrons or the holes generated in the photoelectric converting portion are accumulated in the charge accumulation region by controlling the voltage applied to the electrode, which is placed through the insulating layer, one of the electrons and holes are captured by dangling bonds or an interfacial potential at the interface portion. On the other hand, the other of the electrons and holes are accumulated at a different time in the charge accumulation region by reversing the polarity of the voltage. Thus, the electrons and holes generated at different times are accumulated in the charge accumulation region of the potential well formed in the photoelectric converting portion. In brief, under the condition that one of the electrons and holes are captured in the charge accumulation region, the other of the electrons and holes are accumulated in the charge accumulation region, so that the electrons and holes are recombined, and disappear. Therefore, by using at least one of remaining electrons and holes not recombined after the recombination, it is possible to provide the received light output corresponding to the difference between the electrons and holes generated at different times in the photoelectric converting portion.

A still another concern of the present invention is to provide a photodetection method, which is based on the common technical concept to the photodetector described above, and characterized by comprising the steps of:

preparing a photodetection device comprising a photoelectric converting portion configured to generate electrons and holes by irradiation of light, and a pair of electrodes formed on the photoelectric converting portion through an insulating layer;

accumulating at least one of the electrons and holes generated in the photoelectric converting portion by irradiation of light in a first accumulation region, which is a potential well formed in the photoelectric converting portion by applying a voltage to one of the electrodes;

accumulating the other of the electrons and holes generated in the photoelectric converting portion by irradiation of light in a second accumulation region, which is a potential well formed in the photoelectric converting portion by applying a voltage to the other electrode;

controlling timings of applying the voltages to the electrodes and polarities of the voltages such that the electrons and holes are transferred between the first and second accumulation regions to recombine the electrons and holes accumulated in the first and second accumulation regions, and then outputting at least one of remaining electrons and holes not recombined.

According to this method, after electrons (or holes) are accumulated in the first accumulation region in a period of receiving the signal light and the environmental light, and the electrons accumulated in the first accumulation region are transferred to the second accumulation region, holes (or electrons) can be accumulated in the first accumulation region in a period of receiving only the environmental light. Subsequently, by controlling the timings of applying the voltages to the pair of electrodes and the polarities of the voltages, the electrons and holes accumulated in the first and second accumulation regions are recombined, so that the environmental-light component can be offset.

Further characteristics and advantages brought thereby will be clearly understood from the best mode for carrying out the invention described below.

BRIEF EXPLANATION OF THE DRAWINGS

FIGS. 4A to 4F are explanatory diagrams showing a distance measurement principal of the spatial information detecting device;

FIGS. 5A to 5D are explanatory diagrams showing a distance measurement principal of the spatial information detecting device;

FIG. 6 is schematic diagram of a photodetector according to a second embodiment of the present invention;

FIG. 7 is a partially cross-sectional view of the photodetector with a light shielding film;

FIG. 8 is a partially cross-sectional view of the photodetector with a converging lens;

FIGS. 9A and 9B are a partially cross-sectional view and an explanatory view of a photodetector according to a third embodiment of the present invention;

BEST MODE FOR CARRYING OUT THE INVENTION (Principal of Operation)

Figure 16:
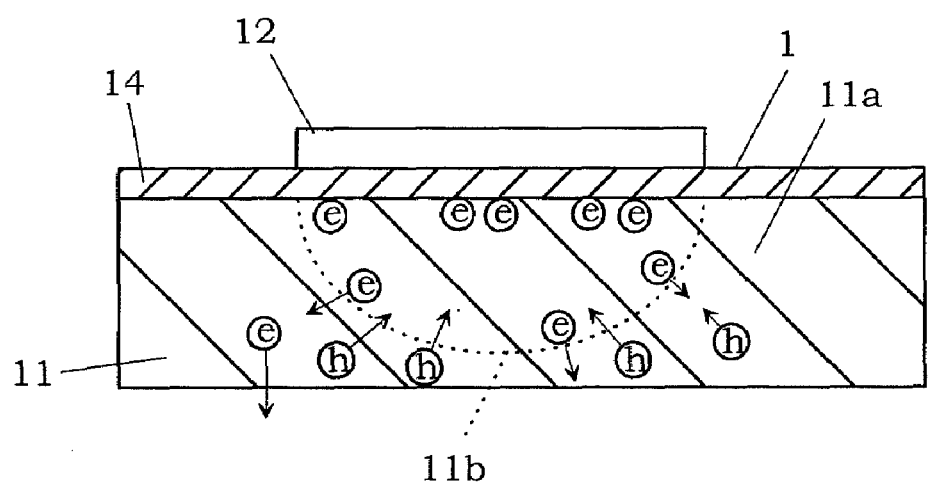
FIG. 16 is an explanatory diagram showing the principle of operation of a photodetector of the present invention.

First, the principal of operation of the present invention is explained. As shown in FIG. 16, a photodetector of the present invention has a structure that an accumulation electrode 12 is formed on a surface of a main function layer 11 (e.g., n-type silicon layer), which constructs a photoelectric converting portion 1, through an insulating layer 14 (e.g., silicon oxide film). An accumulation voltage applied to the accumulation electrode 12 is provided by either a positive voltage or a negative voltage with respect to, as a reference potential, a potential of the main function layer 11 (or a potential of an intermediated layer (FIG. 2), on which the main function layer 11 is stacked, as described below). When the positive accumulation voltage is applied to the accumulation electrode 12, a potential well for accumulating electrons is formed as an accumulation region 11b in the main function layer 11. When the negative accumulation voltage is applied to the accumulation electrode 12, a potential well for accumulating holes is formed as the accumulation region 11b in the main function layer 11.

In the main function layer 11, a portion adjacent to the accumulation electrode 12 functions as a photosensitive portion 11a for generating electrons and holes when a light is incident on the portion. One of the electrons and holes generated in the photosensitive portion 11a are accumulated in the accumulation region 11b according to the polarity of the accumulation voltage applied to the accumulation electrode 12. That is, when the accumulation voltage is positive, the electrons are accumulated in the accumulation region 11b. On the contrary, when the accumulation voltage is negative, the holes are accumulated in the accumulation region 11b.

In the following explanation, an intensity-modulated signal light is projected from a light emitting source (not shown), and the signal light is received by the photoelectric converting portion 1. In addition, the intensity of the signal light is modulated by a rectangular wave. Lighting and extinction of the light emitting source are alternately repeated. That is, when the light emitting source is in the lighting period, the signal light and environmental light are incident on the photoelectric converting portion 1, and when the light emitting source is in the extinction period, only the environmental light are incident on the photoelectric converting portion 1. Therefore, electrons can be accumulated in the accumulation region 11b during the lighting period, and holes can be accumulated in the accumulation region 11b during the extinction period. In addition, the explanation is simplified by not considering various factors. That is, it is regarded that when amounts of electrons corresponding to a received light output with respect to both of the signal light and the environmental light are recombined with the amounts of holes corresponding to the received light output with respect to only the environmental light, the amounts of remaining electrons after the recombination process correspond to the received light output with respect to the signal light. In fact, the carriers remaining after the recombination process are not limited to electrons. Holes or both of electrons and holes may remain. Whatever, it can be said that the received light output having a reduced environmental-light component is obtained when the remaining carriers (electrons and/or holes) are taken out as the received light output, as compared with the case of not performing the recombination.

In FIG. 16, electrons are designates by (e), and holes are designated by (h). This drawing shows a moment of switching a state where a positive accumulation voltage is applied to the accumulation electrode 12 to accumulate electrons to another state where a negative accumulation voltage is applied to the accumulation electrode 12 to accumulate holes. At this moment, most of the accumulated electrons are removed from the accumulation region 11b because the accumulation voltage becomes the negative value. However, electrons captured at the vicinity of a surface of the main function layer 11 by dangling bonds or an interfacial potential are maintained in the accumulation region 11b. In addition, electrons generated by irradiation of light are removed from the main function layer 11, and holes generated by irradiation of light are collected in the accumulation region 11b. That is, parts of the electrons removed from the accumulation region 11b and parts of the holes collected in the accumulation region 11b are recombined and offset. Moreover, the electrons captured in the accumulation region 11b and the holes accumulated in the accumulation region 11b are recombined and offset. After the recombination process, at least one of electrons and holes remain in the accumulation region 11b. Therefore, the remaining carriers can be taken out as the received light output.

In the above case, a single accumulation electrode 12 is formed on the photoelectric converting portion 1, and the electrons and holes generated at different times in the photoelectric converting portion 1 are recombined, so that the remaining carriers after the recombination process are taken out as the received light output. However, when forming a single accumulation region 11b, there is a fear that the carriers removed from the accumulation region 11b at the time of switching the polarity of the accumulation voltage can not efficiently contribute to the recombination. Therefore, in the following embodiment, it is explained about a case where a holding region 11c (FIG. 1) for holding the carriers removed from the accumulation region 11b is separately formed from the accumulation region 11b, and the carriers are exchanged between the accumulation region 11b and the holding region 11c to efficiently achieve the recombination.

First Embodiment

Figure 1:
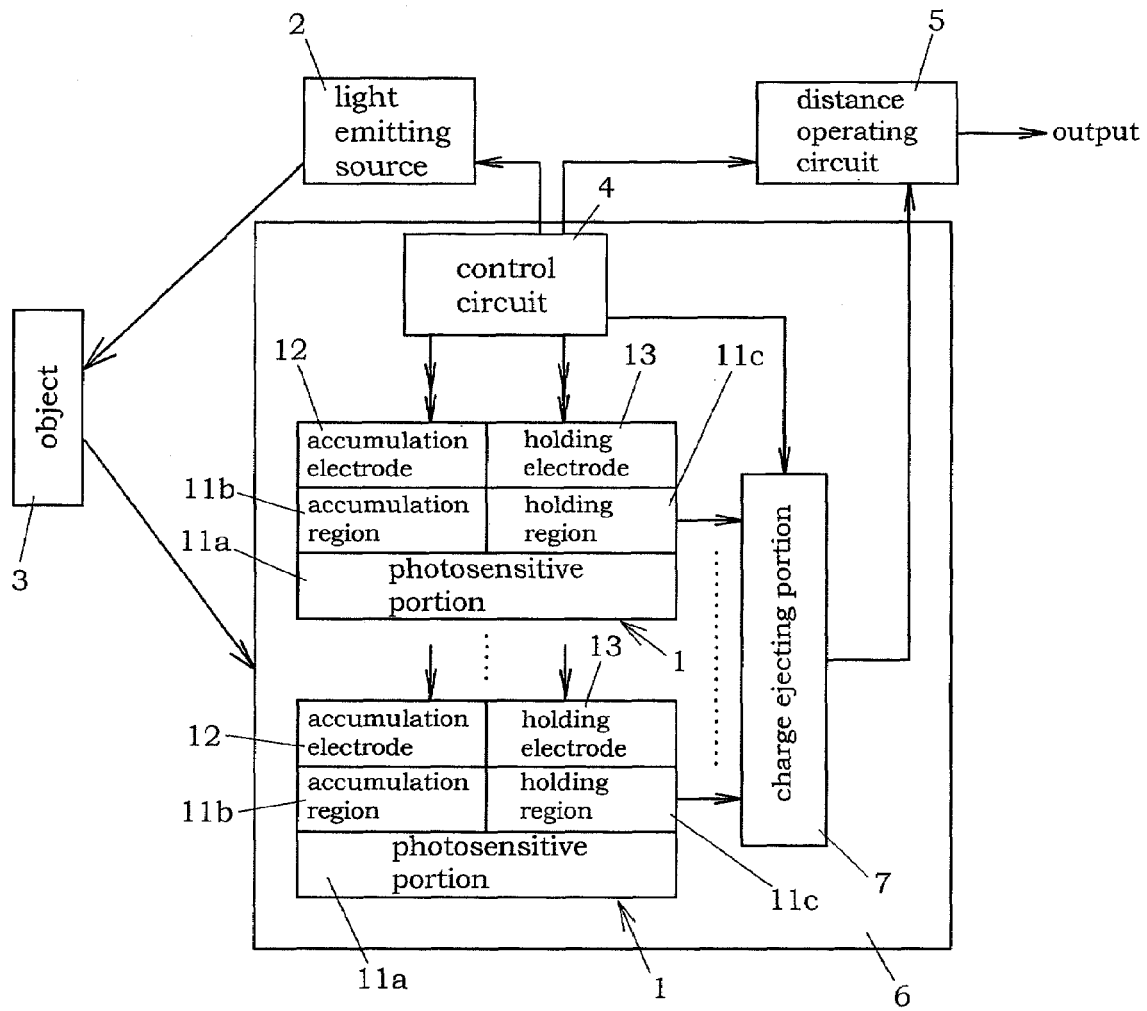
FIG. 1 is a block diagram showing a spatial information detecting device using a photodetector according to a first embodiment of the present invention.

FIG. 1 shows a distance measuring device that is a kind of a spatial information detecting device using a photodetector 6 of the present embodiment. In this distance measuring device, a light is projected from a light emitting source 2 to a target space including an object 3 to be measured, and the photodetector 6 receives the light including a reflected light on the object from the target space, so that a received light output with a light amount of the reflected light is obtained from the photodetector 6. To measure a distance to the object by this kind of configuration, a technique using the principle of triangulation, or a technique of measuring a flight time of light from the light emitting source 2 to the photodetector 6 is mainly utilized.

When using the principal of triangulation, parallel light beams of a predetermined pattern are projected from the light emitting source 2 to the target space, and the pattern projected on the target 3 is received by the photodetector 6 through an optical system for receiving light, so that the received light position on the photodetector 6 is converted into a distance. On the other hand, when measuring the flight time of light, the light projected from the light emitting source 2 to the target space is previously intensity-modulated by an appropriate modulation waveform, and a time difference or a phase difference between the modulation waveforms of the light projected from the light emitting source 2 and the light received by the photodetector 6 is determined. The time difference can be used as the flight time. Alternatively, by converting the phase difference into the flight time, the distance can be determined from the flight time. The following embodiments use the technique of projecting the intensity-modulated light from the light emitting source, and determining the distance to the object 3 according to the flight-time of light. The present invention is also available to reduce the influence of environmental light in the case of using the principle of triangulation. In addition, the technical concept of the present invention is not limited to the purpose of measuring the distance to the object. That is, the present invention is available for various purposes needed to detect a received light amount, for example, a fine particle sensor for detecting fine particles according to a change in received light amount, which is caused when light is diffused or attenuated by the fine particles such as smoke, dust and impurities.

In the present embodiment, the light emitting source 2 is driven by a modulation signal having a constant modulation frequency (e.g., 10 MHz), which is output from the control circuit 4, so that the intensity of light projected to the target space is modulated by the modulation signal. In the present embodiment, a rectangular wave is used as a waveform of the modulation signal. Lighting and extinction of the light emitting source 2 are repeated. As the waveform of the modulation signal, another waveform such as a sine wave, a saw-tooth wave or a triangular wave may be used. In the following explanation, a duration where the light emitting source 2 is turned on is a lighting period, and a duration where the light emitting source 2 is turned off is an extinction period. When the light emitting source 2 is turned off, the light incident on the photodetector 6 is only the environmental light, and therefore the light projected in the target space from the light emitting source is not included. When the light emitting source 2 is turned on, the light incident on the photodetector 6 is a sum of the environmental light and the signal light projected in the target space from the light emitting source 2. Therefore, the light received by the photodetector 6 in the extinction period is mainly provided by the environmental light, and the light received by the photodetector 6 in the extinction period is mainly provided by both of the signal light and the environmental light. When lengths of the lighting period and the extinction period are in one-to-one relation to each other, the environmental-light component can be theoretically removed by subtracting the received light amount obtained in the extinction period from the received light amount obtained in the lighting period to extract only the signal light component.

The received light output provided from the photodetector 6 is sent to a distance operating circuit 5 as an evaluation unit. In the distance operating circuit 5, by using the received light outputs obtained at plural timings from the photodetector 6, a flight time of light is determined from a time difference or a phase difference between waveforms of the intensity-modulated light irradiated from the light emitting source 2 and the intensity-modulated light received by the photodetector 6, and then the distance to the object 3 is determined from the flight time of flight.

The photodetector 6 has a photoelectric converting portion(s) 1 for converting light into an electric signal. When using only one photoelectric converting portion 1, the distance can be detected with respect to only the object 3 existing in a specific direction from the photoelectric converting portion 1. On the other hand, as shown in FIG. 1, when the photodetector 6 is formed with an arrangement of a plurality of the photoelectric converting portions 1, a light receiving optical system is disposed in front of the photodetector 6, and a direction of observing the target space from the photodetector 6 through the light receiving optical system is associated with a position of each of the photoelectric converting portions 1, it is possible to generate a distance image where each of pixel values has distance information in the respective direction. In the present embodiment, it is explained about the case of using the photodetector 6 comprising the photoelectric converting portions 1 arranged on lattice points of a plane lattice having rectangular unit lattices, and a charge ejecting portion 7 for ejecting outputs of the photoelectric converting portions 1 to the outside, and generating the distance image by use of this photodetector 6. That is, the photodetector 6 functions as an image pick-up device for generating the distance image. The charge ejecting portion 7 that is an output unit of the photodetector is provided by a CCD, as described below, and the photoelectric converting portions 1 function as a part of the charge ejecting portion 7. In addition, the control circuit 4 that is a control unit of the photodetector of this embodiment controls a voltage applied to each of electrodes described below and the charge ejecting portion 7, and outputs the modulation signal to the light emitting source 2 of the light projecting unit and the distance operating circuit 5 of the evaluation unit.

Figure 2:
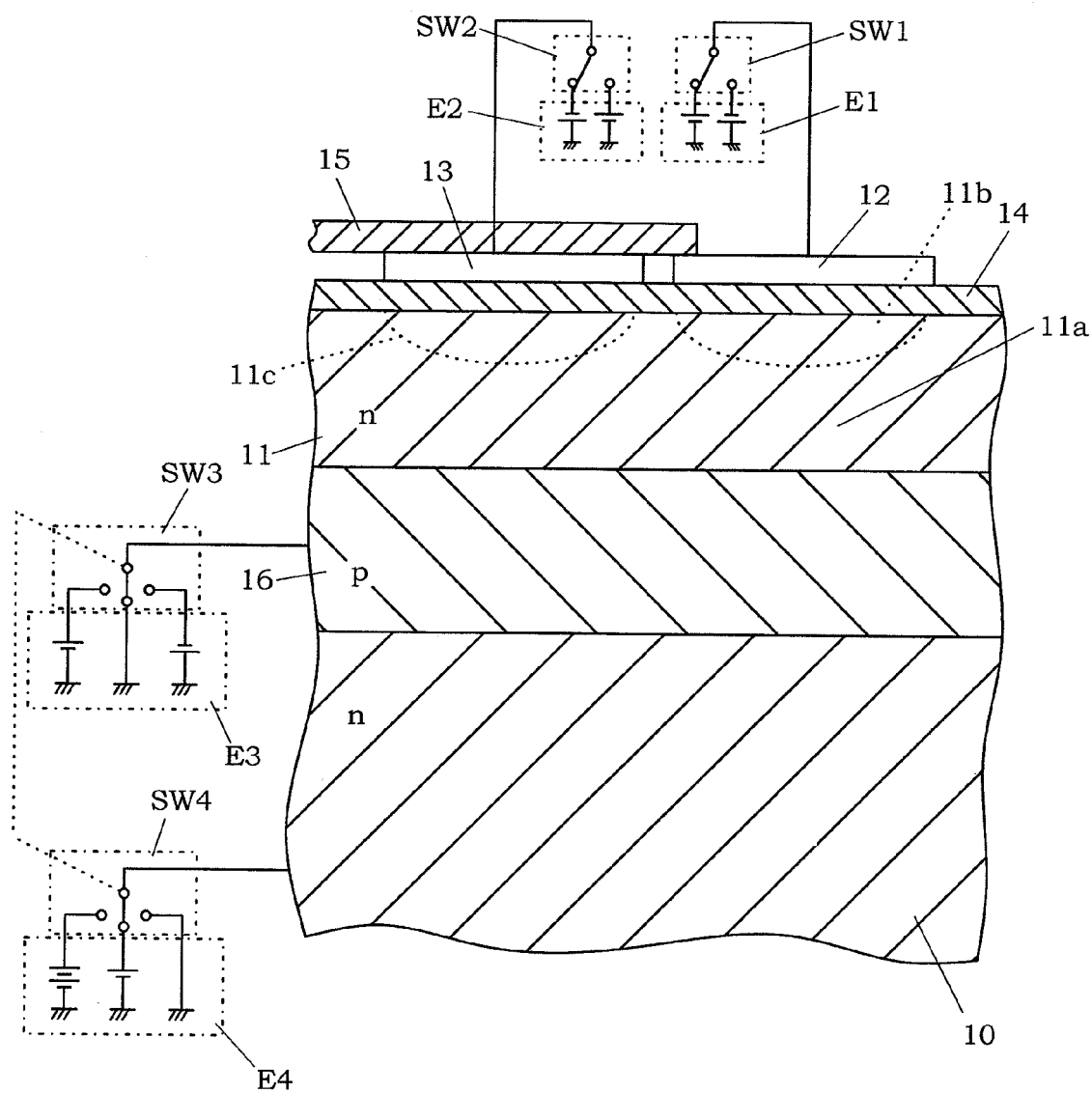
FIG. 2 is a schematic cross-sectional view of the photodetector of the present embodiment.

In each of the photoelectric converting portions 1 having a structure shown in FIG. 2, a main function layer 11 of an n-type silicon layer is formed on a substrate 10 of an n-type silicon layer via an intermediate layer 16 of a p-type silicon layer. A surface of the main function layer 11 (i.e., a general surface lying opposite to the substrate 10 in the thickness direction of the main function layer 11) is covered by an insulating layer 14 of a silicon oxide film. In addition, the substrate 10, the main function layer 11 and the intermediate layer 16 are shared by the plurality of photoelectric converting portions 1. The accumulation electrode 12 and the holding electrode 13 are formed on the general surface of the main function layer 11 through the insulating layer 14. The holding electrode 13 and a part of the accumulation electrode 12 are covered by a light-shielding film 15. Potential wells are formed as the accumulation region $11b$ and the holding region $11c$ in the main function layer 11 by applying an accumulation voltage and a holding voltage to the accumulation electrode 12 and the holding electrode 13, respectively.

The accumulation electrode 12 and the insulating layer 14 have translucency. Therefore, a light incident on a portion not covered by the light-shielding film 15 reaches the main function layer 11 through the accumulation electrode 12. That is, a portion not covered by the light-shielding film 15 of the substrate 10, the main function layer 11 and the intermediate layer 16 functions as a photosensitive portion $11a$ (FIG. 1) for generating electrons and holes in the photoelectric converting portion 1. In the drawing, a part of the light-shielding film 15 is extended to the accumulation electrode 12. This is to prevent that electrons and holes generated in the main function layer 11 by light excitation are directly accumulated in the holding region $11c$ formed in a region corresponding to the holding electrode 13 of the main function layer 11.

In the above described photoelectric converting portion 1, when light is incident on the photosensitive portion $11a$, which is not covered by the light shielding film 15, electrons and holes are generated. In addition, when the accumulation voltage is applied to the accumulation electrode 12, a potential well is formed as the accumulation region $11b$ in the main function layer 11, and when the holding voltage is applied to the holding electrode 13, a potential well is formed as the holding region $11c$ in the main function layer 11. A distance between the accumulation electrode 12 and the holding electrode 13 and magnitudes of the accumulation voltage and the holding voltage are set such that electrons and holes can be transferred between the accumulation region $11b$ and the holding region $11c$ formed as the potential wells.

In a period where electrons and holes are generated in the photosensitive portion $11a$ to obtain the received light output corresponding to the amounts of light incident on the photosensitive portion $11a$, the intermediate layer 16 is maintained at a reference potential (ground potential), and the substrate 10 is maintained at a higher potential than the reference potential. That is, there is a reverse-bias relation between the substrate 10 and the intermediate layer 16. Each of a substrate voltage applied to substrate 10 and a reset voltage applied to the intermediate layer 16 can be switched in three stages. That is, the substrate voltage can be switched among two stages of high potentials and the ground potential. The reset voltage can be switched among a low potential, the ground potential and a high potential. The substrate voltage and the reset voltage are controlled by the control circuit 4 such that when the substrate voltage is the ground potential, the reset voltage is the low potential, when the substrate voltage is a higher one of the high potentials, the reset voltage is the high potential, and when the substrate voltage is a lower one of the high potentials, the reset voltage is the ground potential. In the following explanation, the case of having a high potential with respect to the reference potential is called as positive polarity, and the case of having a low potential with respect to the reference potential is called as negative polarity.

In the configuration of FIG. 2, each of the substrate voltage and the reset voltage can be switched by a combination of a DC power source (E3, E4) and a switch (SW3, SW4). That is, one of three different voltages, i.e., the high and low positive voltages and the ground voltage can be output from the DC power source "E4". In addition, one of three different voltages, i.e., the positive and negative voltages and the ground voltage can be output from the DC power source "E3'". Each of the switches "SW3" and "SW4" is a three contact switch, by which one of the output voltages of the respective DC power source (E3, E4) is selectively supplied. The timings of switching the substrate voltage and the reset voltage are controlled by the control circuit 4, That is, selecting the substrate voltage and the reset voltage by the control unit 4 corresponds to switching the switches (SW3, SW4). In this case, the switches (SW3, SW4) are interlocked such that a potential difference of the substrate voltage with respect the reset voltage is constant, and the substrate voltage is switched in three stages in response to the reset voltage. Alternatively, a constant voltage having a higher potential than the rest voltage irrespective of the reset voltage may be used as the substrate voltage because there is a reverse-bias relation between the substrate 10 and the intermediate layer 16 when the substrate voltage is a higher potential with respect to the reset voltage.

Each of the accumulation voltage applied to the accumulation electrode 12 and the holding voltage applied to the holding electrode 13 can be switched in two stages between positive and negative values. The timings of switching the accumulation voltage and the holding voltage are controlled by the control circuit 4, as in the case of switching the substrate voltage and the reset voltage. In FIG. 2, the functions of applying the accumulation voltage and the holding voltage in the control circuit 4 are schematically shown by combinations of DC batteries (E1, E2) and switches (SW1, SW2). Each of the DC batteries (E1, E2) used to apply the accumulation voltage and the holding voltage has the capability of outputting one of positive and negative voltages, which can be switched by the switches (SW1, SW2). That is, selecting the accumulation voltage and the holding voltage in the control circuit 4 corresponds to switching the switches (SW1, SW2).

When the accumulation voltage is a positive value, electrons can be accumulated in the accumulation region 11b. When the accumulation voltage is a negative value, holes can be accumulated in the accumulation region 11b. Similarly, when the holding voltage is a positive value, electrons can be accumulated in the holding region 11c. When the holding voltage is a negative value, holes can be accumulated in the holding region 11c. In the present embodiment, electrons generated as carriers in the photosensitive portion 11a are used as the received light output.

In the above photodetector 6, electrons and holes generated depending on the amounts of light incident on the photosensitive portion 11a are accumulated at different timings. After the accumulated electrons and holes are recombined, remaining electrons not recombined are taken out. Therefore, when electrons and holes exist in the photosensitive portion 11a before an intended light is incident on the photosensitive portion 11a, it means that an undesired component are included in the electrons taken out from the photosensitive portion 11a. That is, the number of electrons taken out the photosensitive portion 11a does not correspond to the light amount received by the photosensitive portion 11a. Therefore, it is needed to discard the unwanted electrons and holes from the photoelectric converting portion 1 prior to the accumulation of electrons and holes in the accumulation region 11b.

In the case of discarding the unwanted electrons and the holes in the photoelectric converting portion 1, they are separately discarded. For example, when discarding the holes firstly, the accumulation voltage and the holding voltage are set to positive values to keep the holes out of the accumulation region 11b and the holding region 11c. At this time, the reset voltage is set to a negative value. In this state, since the holes move toward the intermediate layer 16, this state is continued for a time period in consideration of the mobility of holes until the holes substantially disappear from the photoelectric converting portion 1. After the holes are discarded, the electrons still exist in the photoelectric converting portion 1. Next, to discard the electrons, the accumulation electrode and the holding electrode are set to negative values, the rest voltage is set to a positive value, and the substrate voltage is set to higher than the reset voltage. The unwanted electrons existing in the photoelectric converting portion 1 move toward the intermediate layer 16. Parts of the electrons are discarded from the intermediate layer 16. The balance of the electrons passing through the intermediate layer 16 are discarded from the substrate 10. As described above, by discarding the electrons and holes from the photoelectric converting portion 1 to reset the photodetector 6, amounts of electrons and holes existing in the photoelectric converting portion 1 become amounts of them under the thermal equilibrium state. The photodetector 6 is reset every time the received light output is taken out from the photodetector 6.

After the photodetector 6 is reset, a positive accumulation voltage is applied to the accumulation electrode 12 to accumulate electrons in the accumulation region 11b. At this time, a negative holding voltage is applied to the holding electrode 13 such that electrons are not accumulated in the holding region 11c. Though electrons and holes are generated in the photosensitive portion 11a by the incidence of light, a potential gradient occurs from the accumulation electrode 11b toward the holding region 11c in the main function layer 11 because the accumulation voltage is the positive value, and the holding voltage is the negative value. In addition, by selecting the ground potential as the rest voltage applied to the intermediate layer 16, a potential gradient occurs from the accumulation region 11b toward the intermediate layer 16 in the vicinity of a portion, to which light is irradiated, of the main function layer 11. Moreover, a potential gradient occurs from the intermediate layer 16 toward the holding region 11c at the portion covered by the light-shielding film 15 of the main function layer 11. However, since light is not irradiated to this portion, holes are hardly accumulated in the holding region 11c.

After electrons are accumulated in the accumulation region 11b, the accumulation voltage and the holding voltage are respectively set to negative and positive values under the condition that the reset voltage is maintained at the ground potential. At this time, a potential gradient occurs from the intermediate layer 16 toward the accumulation region 11b in the main function layer 11, and a potential gradient occurs from the holding region 11c toward the accumulation region 11b. In addition, a potential gradient occurs from the holding region 11c toward the intermediate layer 16. Therefore, the electrons accumulated in the accumulation region 11b move to the holding region 11c. On the other hand, electrons, which are one of electrons and holes generated in the photosensitive portion 11a by irradiation of light, move to the intermediate layer 16, and the holes move to the accumulation region 11b. According to these procedures, the electrons and holes generated in the photosensitive portion 11a can be separately transferred to the holding region 11c and the accumulation region 11b.

In this regard, when holes exist in the holding region 11c, the holes also move toward the accumulation region 11b. Since the electrons move from the accumulation region 11b to the holding region 11c, and the holes move from the photosensitive region 11a or the holding portion 11c to the accumulation region 11b, the electrons and holes meet up with each other, and are recombined. On the other hand, parts of the electrons are captured by dangling bonds (or an interfacial potential) at a surface of the accumulation region 11b. The captured electrons are recombined with the holes accumulated in the accumulation region 11b, and disappear. Similarly, parts of the holes are captured by dangling bonds (or an interfacial potential) at a surface of the holding region 11c. The captured holes are recombined with the electrons transferred to the holding region 11c, and disappear.

Subsequently, when the polarities of the accumulation electrode and the holding electrode are switched (i.e., the accumulation voltage is a positive value, and the holding voltage is a negative value), the electrons of the holding region 11c move toward the accumulation region 11b, and the holes of the accumulation region 11b move toward the holding region 11c. As a result, the electrons and holes meet up with each other, so that they are recombined, and disappear. In addition, the electrons generated in the photosensitive portion 11a are accumulated in the accumulation region 11b, and parts of the electrons accumulated in the accumulation region 11b from the photosensitive portion 11a contribute to the recombination with the holes. In this regard, since parts of the holes existing in the accumulation region 11b are being captured by the dangling bonds (or the interfacial potential) at the surface of the accumulation region 11b, they are recombined with the electrons accumulated from the photosensitive portion 11a or transferred from the holding region 11c into the accumulation region 11b, and disappear. Similarly, since parts of the electrons existing in the holding region 11c are being captured by the dangling bonds (or the interfacial potential) at the surface of the holding region 11c, they are recombined with the holes transferred to the holding region 11c, and disappear.

When the operation of switching the polarities of the accumulation voltage and the holding voltage is repeated plural times, the electrons and holes are recombined, so that the holes disappear almost entirely, and only the electrons remain. In this regard, when the operation of switching the polarities of the accumulation voltage and the holding voltage is performed once, the probability that the electrons and holes meet up with each other is not high. However, by repeating the polarity switching operation plural times, the recombination probability can be increased. That is, when the polarities of the accumulation voltage and the holding voltage are switched plural times, the densities of the electrons and holes concerning the recombination are increased, so that the recombination probability becomes high.

Figure 3A:
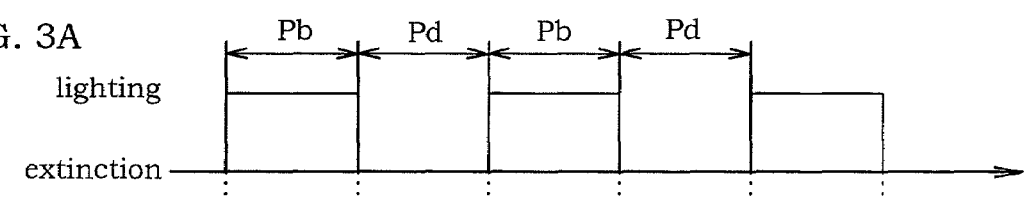
FIGS. 3A to 3C are explanatory diagrams showing timings of applying voltages.
Figure 3B:
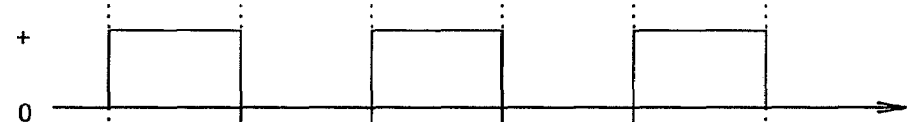
Figure 3C:
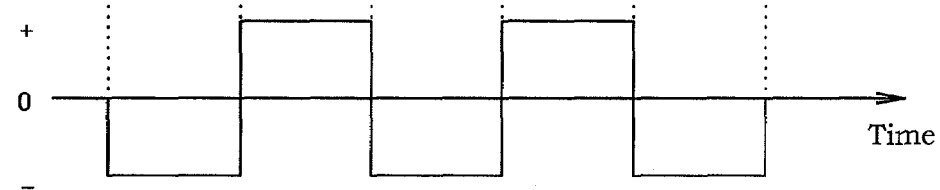

In the present embodiment, it is not essential to match the timings of switching the accumulation voltage and the holding voltage with the lighting period and the extinction period of the light emitting source 2. However, when the timings of switching the accumulation voltage and the holding voltage are matched with the lighting period and the extinction period, it becomes easy to understand the operation. Therefore, it is firstly explained about the case of matching the timings of switching the accumulation voltage and the holding voltage with the lighting period and the extinction period of the light emitting source 2. That is, as shown in FIG. 3A, lighting and extinction of the light emitting source 2 are alternately repeated. In the lighting period "Pb", a positive accumulation voltage is applied to the accumulation electrode 12 (FIG. 3B), and a negative holding voltage is applied to the holding electrode 13 (FIG. 3C). In the extinction period "Pd", a negative accumulation voltage is applied to the accumulation electrode 12 (FIG. 3B), and a positive holding voltage is applied to the holding electrode 13 (FIG. 3C).

In each of the lighting period "Pb" and the extinction period "Pd", electrons and holes are generated in a one-to-one manner in the photosensitive portion 11a. In the lighting period "Pb", the electrons generated in the photosensitive portion 11a are accumulated in the accumulation region 11b. In the extinction period "Pd", the holes generated in the photosensitive portion 11a are accumulated in the accumulation region 11b, and the electrons existing in the accumulation region 11b intend to move from the accumulation region 11b to the holding region 11c. In this regard, since there are dangling bonds at an interface between the accumulation region 11b and the insulating layer 14, parts of the electrons accumulated in the accumulation region 11b in the lighting period "Pb" are captured by the dangling bonds (or an interfacial potential), so that the captured electrons can not move to the holding region 11c. The captured electrons are recombined with the holes accumulated in the accumulation region 11b in the extinction period "Pd", and disappear.

Amounts of the electrons accumulated in the accumulation region 11b in the lighting period "Pb" correspond to the total light amounts of the signal light provided by lighting the light emitting source 2 and the environmental light other than the signal light. Amounts of the holes accumulated in the accumulation region 11b in the extinction period "Pd" correspond to the light amounts of only the environmental light. Therefore, when some electrons are recombined with holes at the accumulation region 11b in the extinction period "Pd", and disappear, it means that at least parts of the electrons corresponding to the light amounts of the environmental light disappear. The amounts of electrons held in the holding region 11c is smaller than the amounts of electrons corresponding to the total light amounts of the signal light and the environmental light. That is, the amounts of the electrons held in the holding region 11c correspond to the light amounts determined by removing a part of the light amount of the environmental light from the total light amounts of the signal light and the environmental light.

In the next lighting period "Pb", the electrons held in the holding region 11c intend to move toward the accumulation region 11b, and the electrons generated in the photosensitive portion 11a are accumulated in the accumulation region 11b. On the other hand, the holes remaining in the accumulation region 11b, which was not recombined with electrons in the previous lighting period "Pd", meet up with the electrons accumulated in the accumulation region 11b, so that they are recombined. In addition, most of the remaining holes not recombined mainly move to the holding region 11c. This is because in the vicinity of the holding region 11c, the potential gradient toward the holding region 11c is larger than the potential gradient toward a deep portion of the main function layer 11.

According to the above-described operations, most of the holes generated by the environmental light are offset by recombining with the electrons. Therefore, a ratio of the amounts of electrons corresponding to the environmental light relative to the amounts of electrons of the signal light can be reduced by repeating the lighting period "Pb" and the extinction period "Pd" plural times. Thus, by taking out the electrons remaining in the holding region 11c after the recombination process from the photodetector 6 as the received light output, the environmental light component can be eliminated from the received light output in some degree.

By the way, according to the above-described operations, when taking out the electrons remaining in the holding region 11c from the photodetector 6 after the recombination, the potential wells formed in the main function layer 11 are controlled to transfer the electrons held in the holding region 11c by regulating the voltages applied to the accumulation electrode 12 and the holding electrode 13. That is, the main function layer 11, the accumulation electrode 12 and the holding electrode 13 are operated as a CCD, so that electrons can be transferred in one of left and right directions in FIG. 1. This function of the main function layer 11 is included in the charge ejecting potion 7 shown in FIG. 1.

As described above, it is necessary to have the period where the amounts of electrons corresponding to the signal light are allowed to remain in the holding region 11c by repeating lighting and extinction of the light emitting source 2 to recombine the electrons and holes, and the period where the remaining electrons in the holding region 11c are taken out from the photodetector 6. In the following explanation, the former period is called as a light receiving period, and the later period is called as an ejection period. In the light receiving period, the control circuit 4 alternately switches the polarities such that the accumulation voltage applied to the accumulation electrode 12 and the holding voltage applied to the holding electrode 13 have different polarities from each other. In the ejecting period, the control circuit 4 controls the timings of applying the voltages such that the electrons are transferred in one direction. In addition, voltage values may be controlled together with the timings.

The voltages applied to the accumulation electrode 12 and the holding electrode 13 in the ejecting period can be controlled, as in the case of controlling a voltage applied to a transfer gate of the CCD. That is, in the present embodiment, as in the case of a conventional frame transfer CCD image sensor, the main function layer 11 is also used as a vertical transfer resistor for transferring carriers. In the photodetector 6, the main function layer 11 is used as the vertical transfer resistor. The electrons provided from the vertical transfer resistor is also transferred by a horizontal transfer resister 21 (FIG. 10), so that the received light output is taken out to the outside of the semiconductor substrate with respect to each of the photosensitive portions 11a. In the above configuration, though the main function layer 11 is used as the transfer resistor, another configuration similar to a conventional interline transfer CCD image sensor may be used. In this case, the carriers held in the holding region 11c of the main function layer 11 are transferred to a vertical transfer resistor formed individually. Thus, the carriers can be taken out to the outside of the semiconductor substrate through the vertical and horizontal transfer resistors.

To measure the distance to the object 3 by use of the above-described photodetector 3, it is needed to determine a time difference or a phase difference between the modulation signal of the light emitting source 2 and the modulation signal included in the light received by the respective photoelectric converting portion 1 (the respective photosensitive portion 11a). In the present embodiment, since a rectangular wave is used as the waveform of the modulation signal, the time difference can be determined. FIG. 4A shows a change in strength of the light projected from the light emitting source 2, and FIG. 4B shows a change in strength of the light received by the photoelectric converting portion 1. To determine the time difference "td" shown in the drawing, there are a technique of using light amounts received by the photoelectric converting portion 1 at the timings corresponding to plural phases synchronized with lighting and extinction of the light emitting source 2, and a technique of using light amounts received by the photoelectric converting portion 1 at plural timings not synchronized with the lighting and extinction of the light emitting source 2.

First, it is explained about the technique of using the received light amounts obtained at the timings synchronized with the lighting and extinction of the light emitting source 2. To easily understand the operations, a section of 180 degrees is set every 90 degrees in phase of the modulation signal, and the received light amount is determined with respect to each of the sections. That is, the received light amounts are determined with respect to four sections of 0 to 180 degrees, 90 to 270 degrees, 180 to 360 degrees and 270 to 90 degrees of the modulation signal. The received light amounts of the respective sections correspond to areas of hatching regions shown in FIGS. 4C to 4F. In this regard, the received light amounts of the respective sections are designated by "A0" to "A3", a strength of the received light corresponding to the total of the signal light and the environmental light is designated by "Ab", and a strength of the received light corresponding to only the environmental light is designated by "Ad". In addition, a period of the modulation signal is "4T", and the time difference is "td". The received light amounts "A0" to "A3" can be represented as below.

$$A0 = Ab \times (2T-td) + Ad \times td$$

$$A1 = Ab \times (T+td) + Ad \times (T-td)$$

$$A2 = Ab \times td + Ad \times (2T-td)$$

$$A3 = Ab \times (T-td) + Ad \times (T+td)$$

From these relationships, (A1-A3)/(A0-A2) is provided by td/(T-td). When s=(A1-A3)/(A0-A2), the time difference "td" can be represented by the following equation: td=sT/(s+1)

That is, the time difference "td" can be determined by using the period "4T" of the modulation signal and the received light amounts "A0" to "A3" of the four sections described above. Since the received light amounts "A0" to "A3" correspond to the received light outputs, the distance operating circuit 5 determines the time difference "td" by using the received light outputs of the photoelectric converting portion 1 given from the photodetector 6 in place of the received light amounts "A0" to "A3", and convert the time difference into a distance to the object 3. The sign of the operation result of the above equation is adequately selected such that the time difference "td" has a positive value.

By the way, as described above, the period of determining the received light output "A0" corresponds to the section of 0 to 180 degrees in the modulation signal, as shown in FIG. 4C. On the other hand, the period of determining the received light output "A2" corresponds to the section of 180 to 360 degrees in the modulation signal, as shown in FIG. 4E. In this embodiment, it is assumed that each of electrons and holes are accumulated at the same probability (accumulation efficiency) in the accumulation region 11b by not considering a difference between the probability that the electrons generated in the photosensitive portion 11a are accumulated in the accumulation region 11b and the probability that the holes generated in the photosensitive portion 11a are accumulated in the accumulation region 11b. In addition, it is assumed that a probability (recombination probability) of recombining electrons and holes is 1.

Under the above assumptions, when the period of applying a positive accumulation electrode to the accumulation electrode 12 is matched with the section of 0 to 180 degrees in the modulation signal, and the period of applying a negative accumulation electrode to the accumulation electrode 12 is matched with the section of 180 to 360 degrees in the modulation signal, the amounts (the number) of the electrons generated in the photosensitive portion 11a and accumulated in the accumulation region 11b correspond to the received light amount "A0", and the amounts (the number) of the holes generated in the photosensitive portion 11a and accumulated in the accumulation region 11b correspond to the received light amount "A2". That is, it can be said that the amounts of electrons remaining in the holding region 11c after the operation of alternately switching the polarity of the accumulation voltage between the section of 0 to 180 degrees and the section of 180 to 360 degrees in the modulation signal correspond to (A0-A2). Similarly, after the polarity of the accumulation voltage is set to positive in the section of 90 to 270 degrees in the modulation signal, and the polarity of the accumulation voltage is set to negative in the section of 270 to 90 degrees in the modulation signal, the amounts of electrons remaining in the holding region 11c correspond to (A1-A3). Therefore, when electron and holes are recombined by alternately switching the polarities of the accumulation voltage applied to the accumulation electrode 12 and the holding voltage applied to the holding electrode 13 in synchronization with the modulation signal, and then the electrons remaining in the holding region 11c are taken out to the outside of the photodetector 6 as the received light output, it is equivalent to perform the operation of (A0-A2) or (A1-A3). As a result, it is possible to reduce the operation amounts performed in the distance operating circuit 5.

In the above, to easily understand the operations, it has been explained about the case where the lighting and extinction of the light emitting source 2 are repeated. However, as described above, another waveform such as a sine wave, a triangular wave or a saw-tooth wave can be used as the waveform of the modulation signal for driving the light emitting source 2. Therefore, it is explained below about the case where a sine wave is used as the waveform of the modulation signal, as show in FIG. 5A.

That is, a strength of the light incident on the photoelectric converting portion 1 is a function of the phase "θ", and represented by the equation: $g(\theta)=(Ab-Ad)\sin\theta+(Ab+Ad)/2$ (FIG. 5B). In this case, since the received light amounts "A0" to "A3" in the respective sections of 0 to 180 degrees, 90 to 270 degrees, 180 to 360 degrees and 270 to 90 degrees of the modulation signal correspond to the areas of the hatching regions shown in FIGS. 5C and 5D, they can be represented by definite integrations shown below. In this regard, the phase "θ" is a function of time "t", and represented by the equation: $\theta=\omega t$ ($\omega=2\pi f$, "f" is a modulation frequency). "Ψ" is a phase difference between projected and received lights (when the unit of "Ψ" is radian, the distance to the object 3 is L [m], velocity of light is "c" [m/s], $L=\Psi \cdot c/2\omega$). A maximum value of the strength of light received by the photoelectric converting portion 1 is designated by "Ab". A minimum value of the strength of light received by the photoelectric converting portion 1 is designated by "Ad". "Ad" corresponds to the strength of light corresponding to the environmental light received by the photoelectric converting portion 1. In the following equations, values shown in the brackets are integral intervals.

$$A0=\int g(\theta)d\theta[-\Psi, 180°-\Psi]$$

$$A1=\int g(\theta)d\theta[90°-\Psi, 270°-\Psi]$$

$$A2=\int g(\theta)d\theta[180°-\Psi, 360°-\Psi]$$

$$A3=\int g(\theta)d\theta[270°-\Psi, 90°-\Psi]$$

when $Aa=Ab-Ad$, and $Ac=(Ab+Ad)/2$, the received light amounts "A0" to "A3" are represented by the following equations.

$$A0=-2Aa\cdot\cos\Psi+Ac\cdot\pi$$

$$A1=-2Aa\cdot\sin\Psi+Ac\cdot\pi$$

$$A2=2Aa\cdot\cos\Psi+Ac\cdot\pi$$

$$A3=2Aa\cdot\sin\Psi+Ac\cdot\pi$$

When (A1-A3)/(A0-A2) is determined from these relationships, it is equal to tan Ψ. Therefore, "Ψ" can be represented by the following equation.

$$\Psi=\tan^{-1}(A1-A3)/(A0-A2) \quad (1)$$

That is, even when the waveform of the modulation signal is the sine wave, the phase difference "Ψ" can be determined by the above equation. Therefore, as in the case of using the time difference "td" when the waveform of the modulation signal is the rectangular wave, the distance to the object 3 can be determined. In addition, even when the sine wave is used as the waveform of the modulation signal, it is possible to obtain the received light outputs corresponding to (A0-A2) and (A1-A3) from the photoelectric converting portion 1, as in the case of using the rectangular wave.

Obtaining the received light output corresponding to (A0-A2) or (A1-A3) is based on the assumption that an efficiency of accumulating electrons in the accumulation region 11b is equal to the efficiency of accumulating holes in the accumulation region 11b, and the assumption that the recombination probability of electrons and holes is 1 (i.e., when electrons meet up with holes, they are surely recombined). In fact, the accumulation efficiencies are not the same, and the recombination probability is much smaller than 1 (e.g., 0.1). Therefore, under the assumption that the recombination probability is 1, the equation (1) is compensated in consideration of the fact that the accumulation efficiency of electrons is different from the accumulation efficiency of holes.

In the above case, since electrons are accumulated in the accumulation region 11b in each of the sections of 0 to 180 degrees and 90 to 270 degrees in phase of the modulation signal, the electrons corresponding to the received light amounts (A0, A1) are accumulated in the accumulation region 11b from the photosensitive portion 11a, and the holes corresponding to received light amounts (A2, A3) are accumulated in the accumulation region 11b from the photosensitive portion 11a.

Now, a ratio of the accumulation efficiency of holes relative to the accumulation efficiency of electrons in the accumulation region 11b is "$\alpha$" ($0<\alpha<1$). That is, the accumulation efficiency of holes is smaller than that of electrons. As parameters giving large influence on the number of electrons and holes accumulated in the accumulation region 11b, it is considered that there are a thickness dimension of the main function layer 11 and a wavelength of the received light, as well as the received light amount, the accumulation voltage and a period of applying the accumulation voltage. Since the thickness dimension of the main function layer 11 and the wavelength of the received light can not be electrically controlled, they are fixed values, and excluded from the parameters. When the accumulation voltage is "Va", and the period of applying the accumulation voltage "Va" is "Pa", the numbers (N0, N1) of the electrons accumulated in the accumulation region 11b with respect to the received light amounts "A0" and "A1" can be respectively represented by the equations: N0=h (A0, Va, Pa) and N1=h (A1, Va, Pa), wherein "h" is an appropriate function. Similarly, the numbers (N2, N3) of the holes accumulated in the accumulation region 11b with respect to the received light amounts "A2" and "A3" can be respectively represented by the equations: N2=$\alpha$h (A2, Va, Pa) and N3=$\alpha$h (A3, Va, Pa)

In addition, when the accumulation voltage "Va" and the applying period "Pa" are constant, and the numbers (N0, N1, N2, N3) are regarded as functions of only the received light amounts (A0, A1, A2, A3), it is obtained that N0=h (A0), N1=h (A1), N2=$\alpha$h (A2), and N3=$\alpha$h (A3). On the other hand, the received light output corresponding to each of the photoelectric converting portions 1 is equivalent to the number of electrons remaining after the recombination process of electrons and holes, and in fact, equivalent to (N0-N2) and (N1-N3). That is, there are the following relationships among (N0-N2),(N1-N3), and the received light amounts (A0, A1, A2, A3).

$$N0-N2 = h(A0) - \alpha h(A2)$$

$$N1-N3 = h(A1) - \alpha h(A3)$$

In addition, when the received light amounts (A0, A1, A2, A3) is represented by use of the numbers of electrons (N0, N1) and the numbers of holes (N2, N3), A0=$h^{-1}$ (N0), A1=$h^{-1}$ (N1), A2=$h^{-1}$ (N2/$\alpha$), and A3=$h^{-1}$ (N3/$\alpha$), wherein "$h^{-1}$" is an inverse function of "h". Therefore, the equation (1) for determining the phase difference "$\Psi$" can be modified, as shown below.

$$\Psi = \tan^{-1} S$$

$$S = \{h^{-1}(N1) - h^{-1}(N3/\alpha)\} / \{h^{-1}(N0) - h^{-1}(N2/\alpha)\}$$

Under the condition that the amounts of electrons or holes generated are not saturated with respect to the received light amounts (A0, A1, A2, A3), the function "h" can be regarded as a linear function, in which the received light amounts (A0, A1, A2, A3) are parameters. Therefore, the following equation is obtained by further modifying the above equation.

$$\Psi = \tan^{-1} \{(\alpha N1 - N3) / (\alpha N0 - N2)\} \quad (2)$$

Therefore, when determining the distance to the object 3 from operational expressions in the distance measuring circuit 5 by use of the received light amounts obtained depending on the amounts of the electrons remaining in the holding region 11c, it must be considered that the received light outputs are (N1-N3) and (N0-N2), and a compensation for the accumulation efficiency "$\alpha$" is needed. For example, an approximate expression of the equation (2) using (N1-N3) and (N0-N2) is prepared, and the accumulation efficiency "$\alpha$" included in the approximate expression is used an adjustment factor for the distance operating circuit 5. Alternatively, the received light output is associated with the distance by a data table in the distance operating circuit 5, and the accumulation efficiency "$\alpha$" is also incorporated in the data table.

The equation (2) has the numbers (N0, N1, N2, N3) of electrons and holes as the parameters, and the numbers (N0, N1, N2, N3) of electrons and holes are functions of the received light amounts (A0, A1, A2, A3), the accumulation voltage "Va" and the applying period "Pa". Therefore, by adjusting at least one of the received light amounts (A0, A1, A2, A3), the accumulation voltage "Va" and the applying period "Pa", the phase difference "$\Psi$" can be determined by using the equation (2).

In the case of adjusting the received light amounts (A0, A1, A2, A3), it is needed to modify the waveform of the modulation signal. For example, the waveform of the modulation signal can be modified by use of a function generator according to a technique such as broken line approximation. In addition, in the above explanation, an absolute value of the accumulation voltage "Va" in the case of accumulating electrons in the accumulation region 11b is set to be equal to the absolute value of the accumulation voltage "Va" in the case of accumulating holes in the accumulation region 11b. Alternatively, when the absolute value of the accumulation voltage "Va" in the case of accumulating holes may be set to be larger than the absolute value of the accumulation voltage "Va" in the case of accumulating electrons, it is possible to obtain the accumulation efficiency "$\alpha$" closer to 1. Furthermore, when the applying period "Pa" of the accumulation voltage "Va" in the case of accumulating holes is set to be longer than the applying period "Pa" of the accumulation voltage "Va" in the case of accumulating electrons, it is possible to obtain the accumulation efficiency "$\alpha$" close to 1.

Similarly, even when the modulation signal has the rectangular wave, the time difference "td" can be accurately determined by compensating in consideration of the accumulation efficiencies of electrons and holes. In addition, much the same is true on the case of using another waveform as the modulation signal.

By the way, it is assumed in the above case that the recombination probability is 1. In fact, the recombination probability of offsetting electrons and holes by recombination is dependent on densities of electrons and holes. On the other hand, there is a case that as the received light amount decreases, it is desired to prevent as far as possible that electrons disappear, and as the received light amount increases, it is desired that larger amounts of electrons disappear to prevent the photodetector 6 from saturation. In such a case, it becomes necessary to adjust the recombination probability according to the received light amount. In the present embodiment, since the electrons and holes generated at the photosensitive portion 11a are recombined, the amounts of the holes change with the amounts of the electrons. As a result, the recombination probability can be automatically adjusted according to the received light amount.

Next, a technique of determining the phase difference "$\Psi$" by use of received light amounts obtained asynchronously with lighting and extinction of the light emitting source 2 is briefly explained. This technique is based on that when a signal having a different frequency from the modulation frequency is interfered (mixed) with the signal corresponding to a change in received light amount, a beat signal with an amplitude, which is changed by a frequency equivalent to a frequency difference therebetween, is obtained. An envelope curve of the beat signal involves the phase difference "Ψ". Therefore, by taking out received light amounts corresponding to the envelope curve at different phases of the envelope curve, it is possible to determine the phase difference "Ψ". For example, when the received light amount is integrated with respect to each of four sections of 0 to 180 degrees, 90 to 270 degrees, 180 to 360 degrees and 270 to 90 degrees in phase of the envelope curve, and the obtained received light amounts are given by A0', A1', A2' and A3', the phase difference "Ψ" can be determined by simply using the received light amounts (A0', A1', A2' and A3') in the equation (1), in place of the received light amounts (A0, A1, A2 and A3).

As a method of obtaining the beat signal, it is thought to take out the received light output proportional to the received light amount, output a local signal having a different frequency from the modulation signal from the control circuit 4, and mix the received light output with the local signal. However, there is a fear that the circuit configuration becomes complex due to the formation of a mixing circuit. For example, when the accumulation voltage is applied to the accumulation electrode 12, and the timing of applying the holding voltage to the holding electrode 13 is controlled by the local signal, the function of the mixing circuit can be realized by use of the accumulation region 11b and the holding region 11c. In brief, by forming the accumulation region 11b and the holding region 11c in the main function layer 11 by use of the local signal with the different frequency from the modulation frequency of the modulation signal, the amounts of the electrons remaining in the hold region 11c become equivalent to the amplitude of the beat signal. Therefore, it is possible to give the received light output corresponding to the amplitude of the beat signal to the distance operating circuit 5 without using the mixing circuit.

Second Embodiment

As shown in FIG. 6, the present embodiment is characterized in that two accumulation electrodes (12a, 12b) and two holding electrodes (13a, 13b) are formed with respect to each of the photoelectric converting portions 1. That is, the two accumulation electrodes (12a, 12b) and the two holding electrodes (13a, 13b) are defined as one group (or one pixel). The two holding electrodes (13a, 13b) are disposed to be spaced from each other. The two accumulation electrodes (12a, 12b) are disposed between the holding electrodes (13a, 13b). In addition, the accumulation electrodes (12a, 12b) are spaced from each other by a gap "g", which is larger than a distance between each of the accumulation electrodes (12a, 12b) and an adjacent holding electrode (13a, 13b). In this configuration, light is incident on the photosensitive portion 11a through an aperture between light-shielding films 15 for covering the holding electrodes (13a, 13b). In addition, as shown in FIG. 7, the light-shielding film 15 is formed to extend between the holding electrodes (13a, 13b) of adjacent photoelectric converting portions 1. Each of a combination of the accumulation electrode 12a and the holding electrode 13a, and a combination of the accumulation electrode 12b and the holding electrode 13b functions in a same manner to the combination of the accumulation electrode 12 and the holding electrode 13 in the first embodiment. In this regard, during the light receiving period, accumulation voltages with opposite polarities are applied to the two accumulation electrodes (12a, 12b), and holding voltages with opposite polarities are applied to the two holding electrodes (13a, 13b).

FIG. 6 shows that the voltages with opposite polarities are applied to the accumulation electrodes (12a, 12b) or the holding electrodes (13a, 13b), the voltage applied to the holding electrode 13a has a reverse polarity with respect to the voltage applied to an adjacent accumulation electrode 12a, and the voltage applied to the holding electrode 13b has a reverse polarity with respect to the voltage applied to an adjacent accumulation electrode 12b. As means for applying the accumulation voltage and the holding voltage by the control circuit 4, a pair of DC power sources (E1, E2) and a pair of two contact switches (SW1, SW2) for switching connection relationships between the DC power source (E1, E2) and the accumulation electrode (12a, 12b) and the holding electrode (13b, 13a) are used. In addition, a voltage value of the accumulation voltage is equal to that of the holding voltage.

In the present embodiment, when the phase of the modulation signal is in a range of 0 to 180 degrees, electrons are accumulated in the accumulation region 11b corresponding to the accumulation electrode 12a, and holes are accumulated in the accumulation region 11b corresponding to the accumulation electrode 12b. In this regard, electrons are taken out as the received light output. That is, according to the operations described later, the received light output is determined by the electrons held in the holding region 11c corresponding to the holding electrode 13a and the electrons remaining in the accumulation region 11b corresponding to the accumulation electrode 12b.

As in the case of the first embodiment, the principle of this embodiment is explained about the case where the modulation signal for driving the light emitting source 2 has a rectangular wave. In addition, the present embodiment is explained under the condition that the accumulation voltage and the holding voltage are switched at a timing synchronized with the modulation signal. The other conditions are already explained in the first embodiment, and operations other than the operations explained in this embodiment are the same as the first embodiment.

In the present embodiment, during the lighting period of the light emitting source 2, the accumulation voltage applied to the accumulation electrode 12a is set to a positive value, and the accumulation voltage applied to the accumulation electrode 12b is set to a negative value. In addition, during the lighting period, the holding voltage applied to the holding electrode 13a is set to a negative value, and the holding voltage applied to the holding electrode 13b is set to a positive value. As described in the first embodiment, unwanted electrons and holes existing in the main function layer 11 are discarded prior to the accumulation of electrons and holes in the accumulation region 11b.

When the accumulation voltages with the above-described polarities are applied to the accumulation electrodes (12a, 12b), and the holding voltages with the above-described polarities are applied to the holding electrodes (13a, 13b), electrons generated in the main function layer 11 by irradiation of light are accumulated in an accumulation region 11b formed at a portion corresponding to the accumulation electrode 12a in the main function layer 11. In addition, holes generated in the main function layer 11 by irradiation of light are accumulated in an accumulation region 11b formed at a portion corresponding to the accumulation electrode 12b in the main function layer 11. That is, the electrons and holes generated in the main function layer 11 are separately accumulated in the two accumulation regions 11b formed at the portions corresponding to the accumulation electrodes (12a, 12b) in the main function layer 11.

Next, in the extinction period where only the environmental light exist, the polarities of the accumulation voltages applied to the accumulation electrodes (12a, 12b) and the holding voltages applied to the holding electrodes (13a, 13b)

are switched. That is, the accumulation voltage applied to the accumulation electrode 12a is set to a negative value, and the holding voltage applied to the holding electrode 13a is set to a positive value. In addition, the accumulation voltage applied to the accumulation electrode 12b is set to a positive value, and the holding voltage applied to the holding electrode 13b is set to a negative value. At this time, with respect to the electrons and holes generated in the photosensitive portion 11a, the holes are accumulated in the accumulation region 11b corresponding to the accumulation electrode 12a, and the electrons are accumulated in the accumulation region 11b corresponding to the accumulation electrode 12b.

Parts of the electrons existing in the accumulation region 11b corresponding to the accumulation electrode 12a in the lighting period are captured by dangling bonds, and the balance of the electrons move to the holding region 11c corresponding to the holding electrode 13a. On the other hand, parts of the holes existing in the accumulation region 11b corresponding to the accumulation electrode 12b in the lighting period are captured by dangling bonds, and the balance of the holes move to the holding region 11c corresponding to the holding electrode 13b. That is, the electrons remaining in the accumulation region 11b corresponding to the accumulation electrode 12a are recombined with the accumulated holes, and the holes remaining in the accumulation region 11b corresponding to the accumulation electrode 12b are recombined with the accumulated electrons.

In the extinction period, the accumulation voltage applied to the accumulation electrode 12a is the negative value, and both of the holding voltage applied to the holding electrode 13a and the accumulation voltage applied to the accumulation electrode 12b are the positive values. Electrons intend to move from the accumulation region 11b corresponding to the accumulation electrode 12a toward the accumulation region 11b corresponding to the accumulation electrode 12b as well as the holding region 11c corresponding to the holding electrode 13a. However, the movements of the electrons toward the accumulation region 11b corresponding to the accumulation electrode 12b are suppressed by the presence of the gap "g". Similarly, holes intend to move from the accumulation region 11b corresponding to the accumulation electrode 12b toward the accumulation region 11b corresponding to the accumulation electrode 12a as well as the holding region 11c corresponding to the holding electrode 13b. However, the movements of the holes toward the accumulation region 11b corresponding to the accumulation electrode 12a are suppressed by the presence of the gap "g". Thus, since the accumulation electrodes are spaced from each other by a relatively large distance, the electrons and holes generated in the photoelectric converting portion can be easily separated into the both accumulation regions.

In the next lighting period following the extinction period, the electrons generated in the main function layer 11 and the electrons held in the holding region 11c corresponding to the holding electrode 13a are accumulated in the accumulation region 11b corresponding to the accumulation electrode 12a, so that the holes previously accumulated in the accumulation region 11b corresponding to the accumulation electrode 12a meet up with these electrons, and they are offset by the recombination. Similarly, the holes generated in the photosensitive portion 11a and the holes held in the holding region 11c corresponding to the holding electrode 13b are accumulated in the accumulation region 11b corresponding to the accumulation electrode 12b, so that the electrons previously accumulated in the accumulation region 11b corresponding to the accumulation electrode 12b meet up with these holes, and they are offset by the recombination.

When the holes accumulated in the accumulation region 11b corresponding to the accumulation electrode 12b in the lighting period move to the holding region 11c corresponding to the holding electrode 13b in a subsequent extinction period, the holes meet up with the electrons provided from the photosensitive portion 11a or the holding region 11c, and they are recombined. Similarly, when the holes accumulated in the accumulation region 11b corresponding to the accumulation electrode 12a in the extinction period move to the holding region 11c corresponding to the holding electrode 13a in a subsequent lighting period, the holes are recombined with the electrons provided from the photosensitive portion 11a or the holding region 11c, and they are recombined.

After repeating the above operation plural times, a component corresponding to the environmental light can be offset with respect to the electrons remaining in the holding region 11c corresponding to the holding electrode 13a, as in the case of the first embodiment. On the other hand, when the accumulation efficiencies of electrons and holes are the same, and the recombination probability of electrons and holes is 1, electron should not remain in the accumulation region 11b corresponding to the accumulation electrode 12b. However, in fact, since the recombination probability is smaller than 1, some electrons remain in the accumulation region 11b corresponding to the accumulation electrode 12b. The remaining electrons are ones generated in the extinction period. However, since parts of them are offset by recombining with the holes generated in the lighting period, the remaining electrons have information of the lighting period. In other words, the remaining electrons in the accumulation region 11b corresponding to the accumulation electrode 12b are equivalent to a component obtained by removing the component corresponding to the environmental light from the component including both of the signal light and the environmental light.

In the light of the above, it is explained about the case of determining a distance from the received light output corresponding to each of the photoelectric converting portions 1 of the photodetector 6. In this embodiment, the remaining electrons in the accumulation region 11b corresponding to the accumulation electrode 12b are used as the received light output. When the accumulation efficiency "$\alpha$" of holes is smaller than 1, and the recombination probability "$\beta$" is smaller than 1, the electrons remain in the accumulation region 11b corresponding to the accumulation electrode 12b. In this regard, the equation (1) is modified by considering the accumulation efficiency "$\alpha$" ($0<\alpha<1$) of holes in the accumulation region 11b and the recombination probability "$\beta$" ($0<\beta<1$) of electrons and holes, in order to determine the distance from the received light output in the distance operating circuit 5. The accumulation voltage "Va" and the applying period "Pa" are the same conditions regardless of electrons or holes.

Considering as in the case of the first embodiment, with respect to the accumulation region 11b corresponding to the accumulation electrode 12a, the numbers (N0, N1) of the electrons accumulated in the accumulation region 11b when the received light amounts are "A0" and "A1" are represented by the equations: N0=h (A0) and N1=h (A1), respectively. In addition, the numbers (N2, N3) of the holes accumulated in the accumulation region 11b when the received light amounts are "A2" and "A3" are represented by the equations: N2 =$\alpha$h (A2) and N3=$\alpha$h (A3), respectively. On the other hand, since the relationship between electron and hole becomes reverse in the accumulation region 11b corresponding to the accumulation electrode 12b, the numbers of holes are provided by "N0"

and "N1", and the numbers of electrons are provided "N2" and "N3". Therefore, N0=αh (A0), N1=αh (A1), N2=h (A2) and N3=h (A3) are obtained.

In addition, the numbers of electrons remaining after the recombination process of electrons and holes are represented by (N0-βN2) and (N1-βN3) with respect to the accumulation region 11b corresponding to the accumulation electrode 12a and the holding region 11c corresponding to the holding electrode 13a. On the other hand, with respect to the accumulation region 11b corresponding to the accumulation electrode 12b and the holding region 11c corresponding to the holding electrode 13b, they are represented by (N2-βN0) and (N3-βN1). Therefore, the numbers of electrons remaining after the recombination process of electrons and holes with respect to the combination of the accumulation electrode 12a and the holding electrode 13a are expressed by the following equations.

$$N0\text{-}\beta N2 = h(A0) - \alpha\beta h(A2) \qquad (a)$$

$$N1\text{-}\beta N3 = h(A1) - \alpha\beta h(A3) \qquad (b)$$

In addition, the numbers of electrons remaining after the recombination process of electrons and holes with respect to the combination of the accumulation electrode 12b and the holding electrode 13b are expressed by the following equations.

$$N2\text{-}\beta N0 = h(A2) - \alpha\beta h(A0) \qquad (c)$$

$$N3\text{-}\beta N1 = h(A3) - \alpha\beta h(A1) \qquad (d)$$

That is, four outputs corresponding to (a), (b), (c) and (d) are obtained as the received light outputs. By determining (a)-(c) and (b)-(d), the following equations are obtained.

$$\begin{aligned}(N0-\beta N2)-(N2-\beta N0) &= (1+\beta)(N0-N2) \\ &= \{h(A0)-\alpha\beta h(A2)\} - \{h(A2)-\alpha\beta h(A0)\} \\ &= (1+\alpha\beta)\{h(A0)-h(A2)\}\end{aligned} \qquad (e)$$

$$\begin{aligned}(N1-\beta N3)-(N3-\beta N1) &= (1+\beta)(N1-N3) \\ &= \{h(A1)-\alpha\beta h(A3)\} - \{h(A3)-\alpha\beta h(A1)\} \\ &= (1+\alpha\beta)\{h(A1)-h(A3)\}\end{aligned} \qquad (f)$$

When a function "h" is regarded as a linear function, (e)/(f)=(A0-A2)/(A1-A3) is obtained. As a result, (A0-A2)/(A1-A3) used in the equation (1) can be determined without compensation by using the four outputs according to this embodiment.

The above procedures can be briefly summarized as below. After the operations of accumulating and holding electrons are repeated with respect to two of four sections defined according to the phase of the modulation signal, which are different from each other by 180 degrees, the received light outputs are taken out from the holding region 11c corresponding to the holding electrode 13a to obtain outputs equivalent to (a) and (c). A difference between these outputs is determined by the distance operating circuit 5. Next, after the operations of accumulating and holding electrons are repeated with respect to two sections different from the above-described two sections of the four sections defined according to the phase of the modulation signal, the received light outputs are taken out from the accumulation region 11b corresponding to the accumulation electrode 12b to obtain outputs equivalent to (b) and (d). A difference between these outputs is determined by the distance operating circuit 5. When dividing one of the thus obtained two difference values by the other, the division result corresponds to (A0-A2)/(A1-A3) of the equation (1), and therefore the phase difference "Ψ" can be determined. In brief, according to this embodiment, by using the difference between the amounts of electrons accumulated in the holding region 11c corresponding to the holding electrode 13a and the amounts of electrons accumulated in the accumulation region 11b corresponding to the accumulation electrode 12b, it is possible to eliminate the influence of the accumulation efficiency "α" and the recombination probability "β", and determine the phase difference "Ψ".

In the present embodiment, the holding electrodes (13a, 13b) are covered by the light-shielding film 15 such that no light is incident on the holding regions 11c corresponding to the two holding electrodes (13a, 13b) formed in each of the photoelectric converting portions 1. Alternatively, a lens array 19 having a plurality of lenses 19a for the photoelectric converting portions 1 may be used, as shown in FIG. 8. The lens array 19 can be formed by integrally molding the lenses with a synthetic resin. Alternatively, separately formed lenses may be supported by use of a lens frame. Each of the lenses 19a is a plane-convex lens, which has a light incident surface configured in a convex shape. In addition, the lenses 19a are arranged such that a boundary between the lenses is in agreement with the boundary between the photoelectric converting portions 1.

The lens 19a is a converging lens. As shown by arrows in FIG. 8, it has a function of allowing the incident light to converge on a center portion of the photoelectric converting portion 1. By this function, it is possible to prevent that light is incident on the holding electrodes (13a, 13b). That is, as in the case of forming the light-shielding film 15, it is possible to prevent that the light is incident on the holding regions 11c corresponding to the holding electrodes (13a, 13b). In addition, since the light incident on a region corresponding to the entire surface of the photoelectric converting portion 1 converges, and proceeds into the photosensitive portion 11a, it is possible to increase an aperture ratio, and enhance the efficiency of light utilization, as compared with the case of forming the light-shielding film 15.

Third Embodiment

In the second embodiment, as the gap "g" becomes wider, the electrons and holes can be easily separated. In the case where the photodetector 6 is formed by arranging a plurality of photoelectric converting portions 1, and the main function layer 11 is also used as the vertical transfer transistor, since the carriers (electrons or holes) are transferred by controlling the potential wells formed in the main function layer 11 with use of the accumulation electrodes (12a, 12b) and the holding electrodes (13a, 13b), there is a fear that the potential wells for transferring the carriers can not be formed at a portion of the gap "g" when the gap "g" is excessively increased.

As shown in FIG. 9A, the present embodiment is characterized by forming a transfer electrode 22 between the accumulation electrodes (12a, 12b). In this case, there are advantages that electrons and holes become easily separated by increasing the distance between the accumulation electrodes (12a, 12b), and also transferring the remaining electrons and holes in the holding region 11c becomes easy.

In this configuration, the gap "g" having a width larger than the width of the transfer electrode 22 can be formed between the accumulation electrodes (12a, 12b) by not applying a transfer voltage to the transfer electrode 22, i.e., keeping the transfer electrode at 0 V during the period of accumulating electrons and holes in the holding region 11c. In addition, when transferring the carriers accumulated in the holding region 11c, the transfer electrode 22 as well as the accumulation electrodes (12a, 12b) and the holding electrodes (13a, 13b) are used. That is, by applying the transfer voltage at an appropriate timing, a potential well can be formed in the main function layer 11 to enhance the carrier mobility.

In the photodetector 6, a region for suppressing a leakage of carriers from the holding region 11c is provided between adjacent photoelectric converting portions 1 in the vertical direction. When the transfer electrode 23 is added to a portion corresponding to the region, it becomes possible to separate the electrons and holes between the adjacent photoelectric converting portions 1 in the vertical direction, and also form a potential well for enhancing the carrier mobility at the time of transferring the carriers. In this configuration, six electrodes of the accumulation electrodes (12a, 12b), the holding electrodes (13a, 13b) and the transfer electrodes (22, 23) are used with respect to 1 group (1 pixel). In brief, a plurality of groups, in each of which the main function layer 11 is shared by the accumulation electrodes (12a, 12b) and the holding electrodes (13a, 13b), are formed, and the transfer electrodes (22, 23) are respectively disposed between adjacent accumulation electrodes (12a, 12b) in each group, and between the holding electrodes (13a, 13b) of adjacent groups.

By the way, in the above case, the accumulation efficiency of holes in the accumulation region 11b is smaller than that of electrons. As discussed in the second embodiment, when the two accumulation electrodes (12a, 12b) and the two holding electrodes (13a, 13b) are formed in each of the photoelectric converting portions 1, and the received light output corresponding to this photoelectric converting portion 1 is used, the influences of the accumulation efficiency "α" and the recombination probability "β" can be eliminated to determine the distance. However, when the accumulation efficiency of holes is extremely smaller than that of electrons, the effects brought by using the recombination of electrons and holes can not be sufficiently obtained. Therefore, in such a case, the accumulation efficiency of holes may be increased by applying an appropriate voltage to the transfer electrode 22 in the period of accumulating electrons and holes in the accumulation region 11b.

That is, when applying a negative accumulation voltage to the accumulation electrode 12a (or 12b), and applying a positive accumulation electrode to the accumulation electrode 12b (or 12a), a negative voltage, which is smaller in absolute value than the accumulation voltage applied to the accumulation electrode 12a (or 12b), is applied to the transfer electrode 22. When the transfer electrode 22 is kept at 0 V by not applying the voltage, it does not contribute to the accumulation of holes. However, by applying the negative voltage with an appropriate magnitude to the transfer electrode 22, the holes generated at the photosensitive portion 11a can be accumulated in a potential well formed at the region corresponding to the transfer electrode 22 as well as the accumulation region 11b corresponding to the accumulation electrode 12a (or 12b), as shown in FIG. 9B. Since the potential well corresponding to the transfer electrode 22 is shallower than the potential well used as the accumulation region 11b for holes, the holes accumulated in the potential well corresponding to the transfer electrode 22 flow into the accumulation region 11b. Therefore, large amounts of holes can be accumulated in the accumulation region 11b, as compared with the case of using only the accumulation electrode 12a (or 12b). In the above case, it is based on the assumption that the accumulation efficiency of holes is smaller than that of electrons. On the contrary, when the accumulation efficiency of electrons is smaller than that of holes, a positive voltage with an appropriate magnitude may be applied to the transfer electrode 22 to use the transfer electrode 22 for the accumulation of electrons. Other configurations and operations are the same as the second embodiment.

Fourth Embodiment

Figure 10:
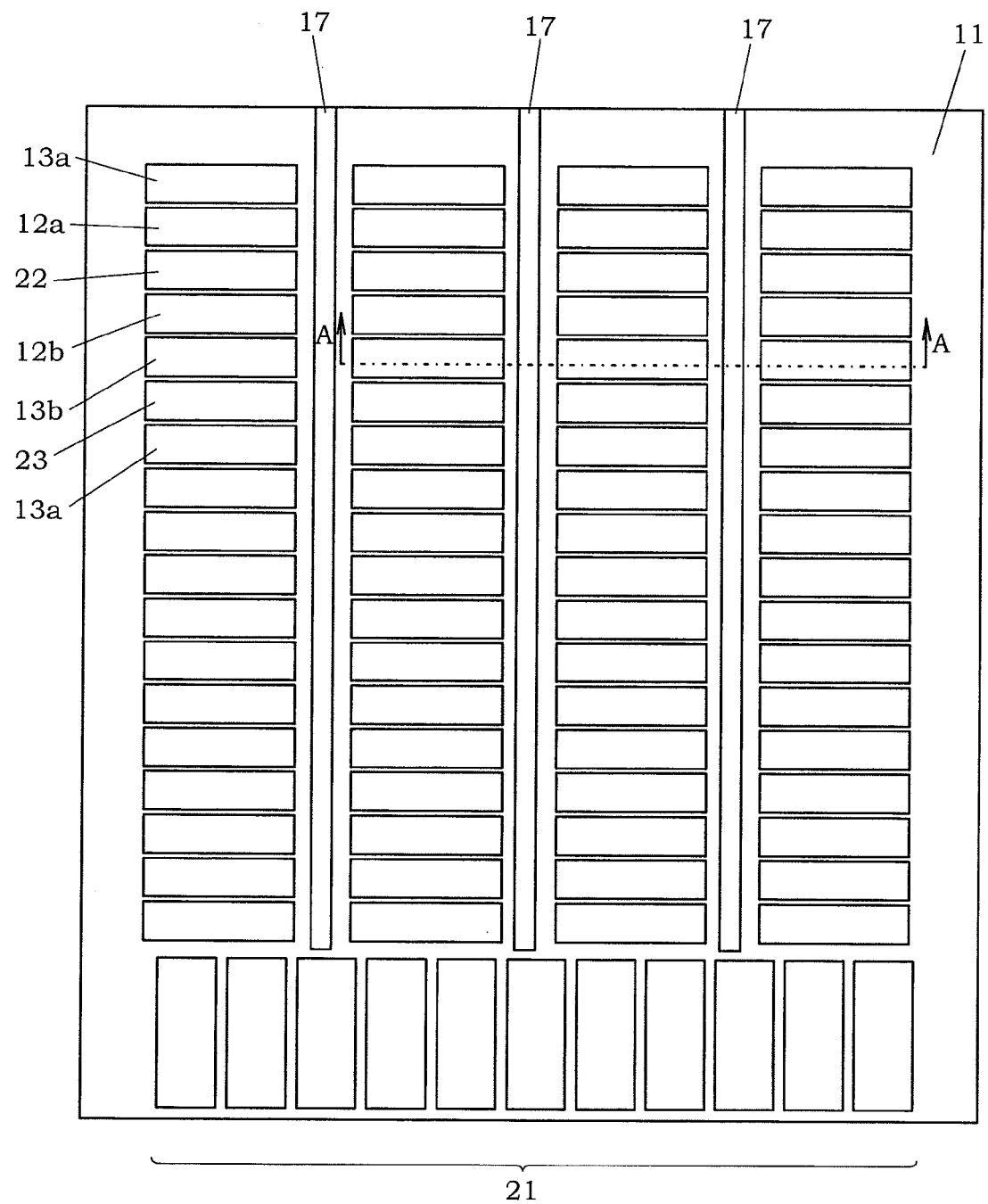
FIG. 10 is a front view of a photodetector according to a fourth embodiment of the present invention.
Figure 11:
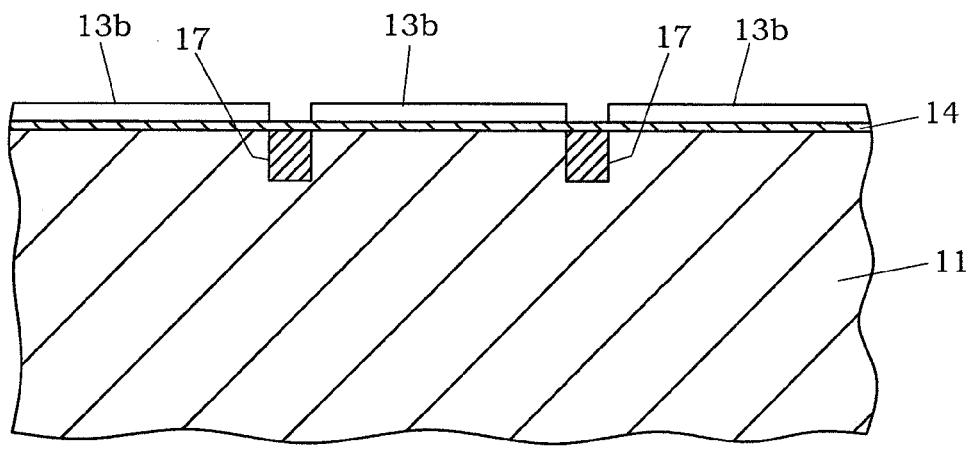
FIG. 11 is a cross-sectional view taken along the line A-A of FIG. 10.

As shown in FIGS. 10 and 11, the present embodiment is characterized by forming a discarding electrode 17 adjacent to the photoelectric converting portion 1, and controlling a discarding voltage applied to the discarding electrode 17 to discard electrons and holes remaining in the photoelectric converting portion 1.

When a plurality of the photoelectric converting portions 1 are arranged in a matrix in a plane, the discarding electrode 17 extending along one of the vertical and horizontal directions is disposed between adjacent photoelectric converting portions 1 in the other of the vertical and horizontal directions. For example, as shown in FIG. 10, when using the main function layer 11 as the vertical transfer resister, the accumulation electrodes (12a, 12b), the holding electrodes (13a, 13b), and the transfer electrodes (22, 23) are arranged in the vertical direction (the lengthwise direction in FIG. 10), and the discarding electrode 17 is formed to extend along the vertical direction between adjacent columns, in each of which the photoelectric converting portions 1 are arranged in the vertical direction. In other words, the discarding electrode 17 is formed on a surface of the photoelectric converting portions 1 so as to extend away from each of the accumulation electrodes and the holding electrodes by a substantially equal distance and in a direction orthogonal to the longitudinal directions of the accumulation electrodes (12a, 12b) and the holding electrodes (13a, 13b), which are configured in a rectangular shape. In this configuration, the carriers are delivered from one end of the vertical transfer resister (i.e., the main function layer 11) to a horizontal transfer resister 21, which constructs the charge ejecting portion 7 in cooperation with the vertical transfer resister. In FIG. 10, four vertical columns each formed by the accumulation electrodes (12a, 12b), the holding electrodes (13a, 13b), and the transfer electrodes (22, 23) are spaced from each other in the horizontal direction. Alternatively, four electrodes arranged in the horizontal direction may be integrally formed without forming the four vertical columns.

The discarding electrode 17 is formed in a region having a predetermined depth (2 to 3 μm) from the general surface of the main function layer 11 provided by an n-type semiconductor layer. An ohmic junction is formed between the main function layer 11 and the discarding electrode 17. By applying a positive or negative discarding voltage to the discarding electrode 17, unwanted electrons and holes remaining in the main function layer 11 can be discarded from the main function layer 11 through the discarding electrode 17. In addition, when keeping the discarding electrode 17 at 0 V without applying the voltage, it is possible to prevent that electrons or holes are mixed between the accumulation regions 11b or between the holding regions 11c, which are formed in adjacent main function layers 11 in the horizontal direction. As a result, the discarding electrode 17 can contribute to improve the charge separation property of the photoelectric converting portion 1. That is, the discarding electrode 17 functions as a separation electrode for separating the photoelectric converting portions 1 from each other in the horizontal direction. A depth of the discarding electrode 17 is determined in consideration of surely discarding the carriers (specifically, holes) remaining in the main function layer 11, and preventing a leakage of the carriers between the photoelectric converting portions 1. Alternatively, by forming the separation electrode of a conductive material for the purpose of separating the photoelectric converting portions 1 from each other in place of forming the discarding electrode 17, the electrons and holes remaining in the main function layer 11 may be discarded via the substrate 10 and the intermediate layer 16.

When discarding the electrons and holes remaining in the main function layer 11 by use of the discarding electrode 17, a discarding voltage with a polarity determined depending on the kind of carrier to be discarded is applied to the discarding electrode 17. For example, it is assumed that electrons remain in the holding region 11c corresponding to the holding electrode 13a, and holes remain in the accumulation region 11b corresponding to the accumulation electrode 12a. As in the case of the first embodiment, it is needed to previously discard unwanted holes remaining in the main function layer 11. After a negative discarding voltage is firstly applied to the discarding electrode 17 to discard the holes, a positive discarding voltage is applied to the discarding electrode 17 to discard unwanted electrons. Concretely speaking, when the negative discarding voltage is applied to the discarding electrode 17, the holes remaining in the accumulation region 11b corresponding to the accumulation electrode 12a are discarded. Subsequently, when the positive discarding voltage is applied to the discarding electrode 17, the electrons remaining in the holding region 11c corresponding to the holding electrode 13a are discarded. It goes without saying that this configuration is available when the conductive type of the substrate 10 is n-type. In addition, even when the conductive type of the substrate 10 is p-type, and carriers can not be discarded via the substrate 10, the carriers remaining in the main function layer 11 can be discarded via the discarding electrode 17.

Figure 12:
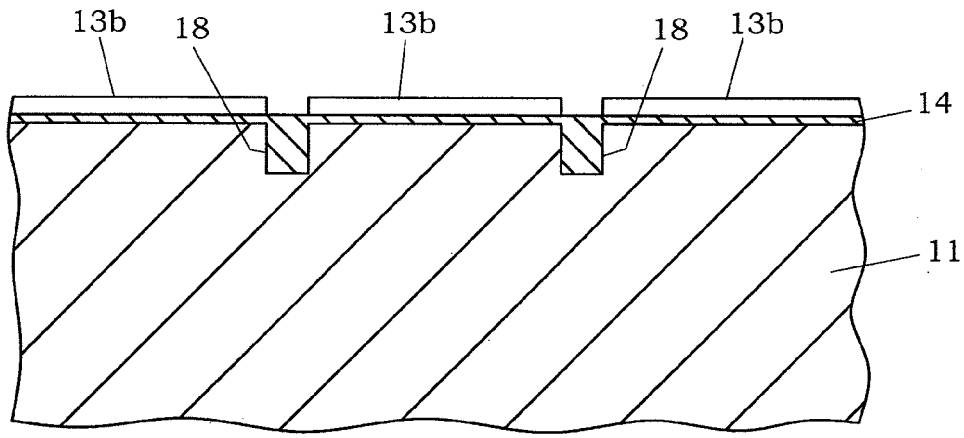
FIG. 12 is a partially cross-sectional view of a modification of the photodetector.

Thus, since both of the electrons and holes remaining in the photoelectric converting portion can be discarded by using the discarding electrode 17, it is possible to suppress an error of the received light output ejected from the photoelectric converting portion with respect to a received light amount in an intended period by removing the unwanted carriers remaining in the photoelectric converting portion. In addition, when it is functioned as the separation electrode, it is possible to prevent that electrons and holes are mixed between adjacent columns, and therefore improve the separation property between the columns In addition, to improve the separation property between the adjacent photoelectric converting portions 1 in the horizontal direction, an insulating separator 18 may be formed between the adjacent photoelectric converting portions 1 in place of the discarding electrode 17, as shown in FIG. 12. The insulating separator 18 is formed by a silicon oxide layer (SiO$_2$) of an insulating material, and integrally formed with the insulating layer 14. A purpose of the insulating separator 18 is to prevent a leakage of the carriers between adjacent photoelectric converting portions 1 in the horizontal direction. Therefore, a depth from the general surface of the insulating separator 18 is determined by the depth of the holding region 11c, and for example the depth can be set to 2 to 3 μm. In the case of forming the insulating separator 18, an electrode for discarding the carriers remaining in the main function layer 11 is separately formed. For example, when an overflow drain is formed at the circumference of the semiconductor substrate constructing the photodetector 6, as in the case of a conventional CCD image sensor, the carriers can be discarded via the overflow drain.

In the drawing, it was shown about the photodetector 6 where the main function layer 11 is used as the vertical transfer resister. Alternatively, the vertical transfer resister may be separately formed from the main function layer 11 to deliver the carriers from the main function layer 11 to the vertical transfer resister through a transfer gate. In this configuration, a portion other than a portion where the transfer gate is formed in each of the main function layers 11 may be surrounded with the discarding electrode 17 or the insulating separator 18.

Fifth Embodiment

Figure 13:
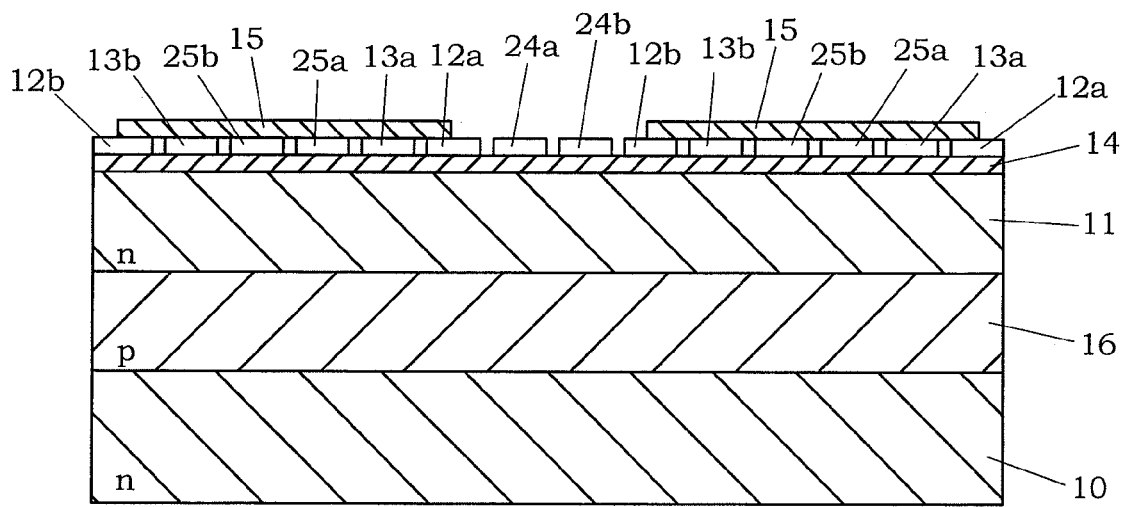
FIG. 13 is a partially cross-sectional view of a photodetector according to a fifth embodiment of the present invention.
Figure 14:
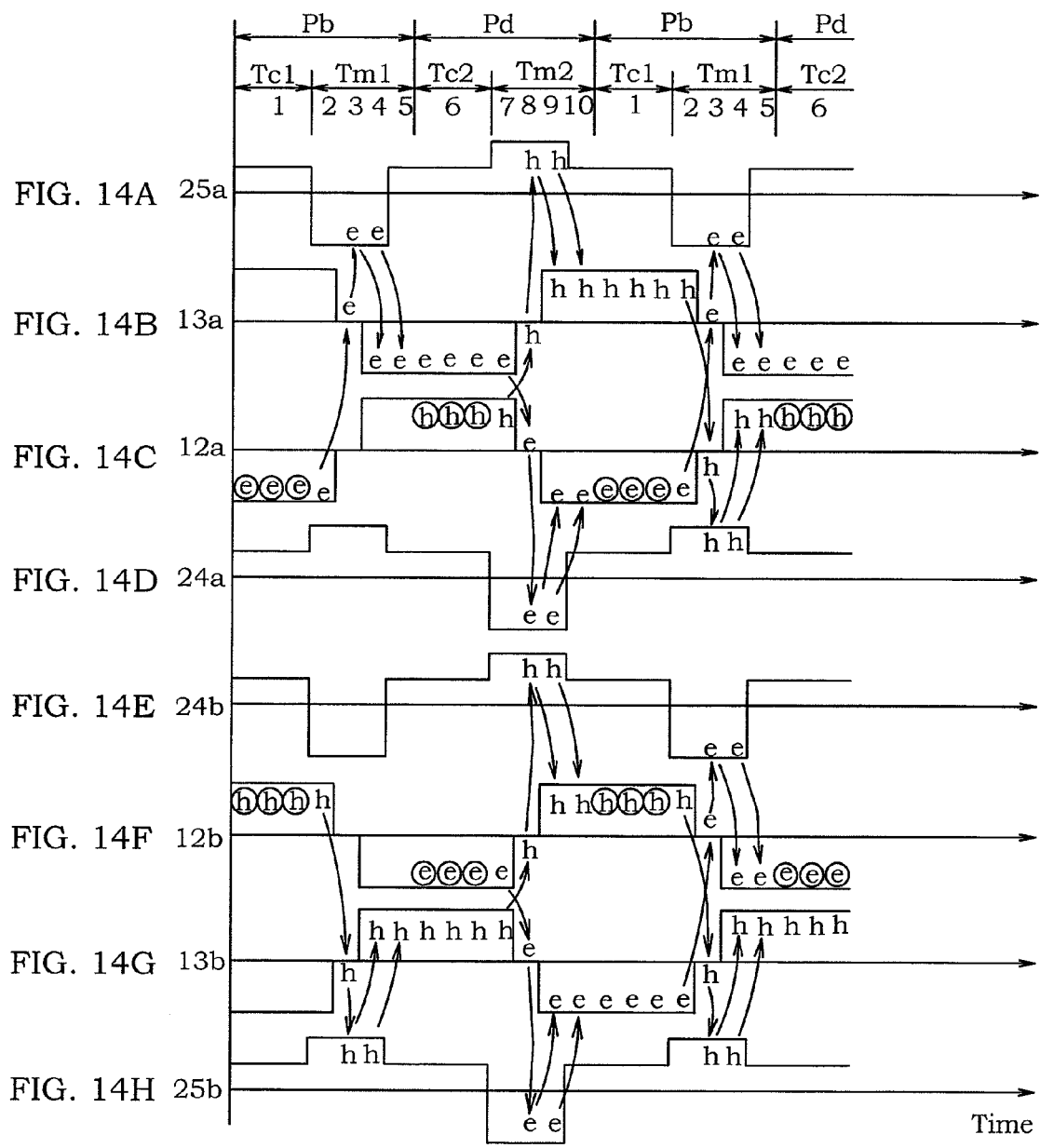
FIGS. 14A to 14H are explanatory diagrams showing timings of applying voltages.

As shown in FIG. 13, the present embodiment is characterized by forming two control electrodes (24a, 24b) in place of the transfer electrode 22 explained in the third embodiment, and two control electrodes (25a, 25b) in place of the transfer electrode 23.

That is, the present embodiment uses two accumulation electrodes (12a, 12b), two holding electrodes (13a, 13b), two control electrodes (24a, 24b) and the two control electrodes (25a, 25b) with respect to one photoelectric converting portion 1. In brief, these eight electrodes are used for one pixel. In the drawing, these electrodes are spaced from each other by an equal distance. In one photoelectric converting portion 1, the control electrodes (24a, 24b) that are transparent to light are disposed between adjacent accumulation electrodes (12a, 12b). In addition, the control electrodes (25a, 25b) that are covered by a light-shielding film 15 are disposed between the holding electrodes (13a, 13b) of adjacent two photoelectric converting portions 1.

Operations of this embodiment are explained referring to FIGS. 14A to 14H. These drawings show a change in depth of each of potential wells formed by applying voltages to the control electrode 25a, the holding electrode 13a, the accumulation electrode 12a, the control electrode 24a, the control electrode 24b, the accumulation electrode 12b, the holding electrode 13b, and the control electrode 25b. In each of the drawings, a center horizontal line designates a state where the potential well is not formed. A lower side of the center horizontal line designates a state where the potential well for electrons is formed. An upper side of the center horizontal line designates a state where the potential well for holes is formed. In other words, when the center horizontal line is a reference potential, a duration where the potential well for electrons is formed corresponds to a period of applying a positive voltage, and a duration where the potential well for holes is formed corresponds to a period of applying a negative voltage.

As clearly understood from FIGS. 14A to 14H, each of accumulation voltages applied to the accumulation electrodes (12a, 12b) and each of holding voltages applied to the holding electrodes (13a, 13b) can be switched in three stages among a positive potential, a negative potential and the reference potential. On the other hand, each of the control electrodes (24a, 24b, 25a, 25b) can be switched in four stages among a positive potential, a high negative potential, a low negative potential and the reference potential. In the drawings, "e" designates electron, and "h" designates hole. In addition, the movements of electrons and holes are shown by arrows. Circles having "e" or "h" therein show electrons or holes accumulated from the photosensitive portion 11a.

As described in the first embodiment, as the basic operation, lighting and extinction of the light emitting source 2 are repeated, and the received light output is obtained according to a difference between the received light amounts obtained in the lighting period "Pb" and the extinction period "Pd". In the present embodiment, an accumulation period "Tc1" and a transfer period "Tm1" correspond to the lighting period "Pb", and an accumulation period "Tc2" and a transfer period "Tm2" correspond to the extinction period "Pd". In the basic operation of the first to fourth embodiments, it is essential to match the timing of switching between the lighting period "Pb" and the extinction period "Pd" with the timing of switching between the accumulation voltage and the holding voltage, as shown in FIG. 3. This means that only the operations for the accumulation periods "Tc1" and "Tc2" are performed. In the operations of this embodiment, it is characterized by setting the transfer period (Tm1, Tm2) between the accumulation periods (Tc1, Tc2). In this case, a diffusion of electrons or holes can be prevented by generating a potential gradient between the accumulation region 11b and the holding region 11c in the transfer period (Tm1, Tm2), and controlling the moving directions of electrons or holes. That is, evacuation regions can be formed at portions corresponding to the control electrodes (24a, 24b, 25a, 25b) in the main function layer 11 by applying appropriate voltages to the control electrodes (24a, 24b, 25a, 25b) in the transfer period (Tm1, Tm2). After electrons or holes are temporarily held in the evacuation regions, they are transferred to the accumulation region 11b or the holding region 11c. Therefore, it is possible to prevent the diffusion of electrons or holes at the timing of reversing the polarities of the accumulation voltage and the holding voltage.

The following is a further detailed explanation. In the operations of FIGS. 14A to 14H, there are ten states provided by different combinations of the accumulation voltages applied to the accumulation electrodes (12a, 12b), the holding voltages applied to the holding electrodes (13a, 13b), and the voltages applied to the control electrodes (24a, 24b, 25a, 25b). The timings of applying these voltages are controlled by the control circuit 4 such that the ten states presents one period (cycle). To distinguish the ten states from each other, the reference numerals "1" to "10" are used in FIGS. 14A to 14H. Changes in voltage in each of the ten states are listed in TABLE 1. In TABLE 1, the voltages are shown in five stages by "+2V", "+V", "0", "−V" and "−2V". "0" is the reference potential, and there is a relationship of "+2V">"+V">"0">"−V">"−2V".

TABLE 1

| STATE | 25a | 13a | 12a | 24a | 24b | 12b | 13b | 25b |
|---|---|---|---|---|---|---|---|---|
| 1 | −V | +2 V | +2 V | −V | −V | −2 V | +2 V | −V |
| 2 | +2 V | +2 V | +2 V | −2 V | +2 V | −2 V | +2 V | −2 V |
| 3 | +2 V | 0 | 0 | −2 V | +2 V | 0 | 0 | −2 V |
| 4 | +2 V | +2 V | −2 V | −2 V | +2 V | +2 V | −2 V | −2 V |
| 5 | −V | +2 V | −2 V | −V | −V | +2 V | −2 V | −V |
| 6 | −V | +2 V | −2 V | −V | −V | +2 V | −2 V | −V |
| 7 | −2 V | +2 V | −2 V | +2 V | −2 V | +2 V | −2 V | +2 V |
| 8 | −2 V | 0 | 0 | +2 V | −2 V | 0 | 0 | +2 V |
| 9 | −2 V | −2 V | +2 V | +2 V | −2 V | −2 V | +2 V | +2 V |
| 10 | −V | −2 V | +2 V | −V | −V | −2 V | +2 V | −V |

The state "1" corresponds to the accumulation period "Tc1", and the state "6" corresponds to the accumulation "Tc2". In each of the accumulation periods "Tc1", "Tc2", the electrons or holes generated in the photosensitive portion 11a are accumulated in the accumulation region 11b, and the electrons or holes transferred to the holding region 11c prior to the accumulation period "Tc1", "Tc2" are held in the holding region 11c. The operations for the accumulation periods "Tc1", "Tc2" are basically the same as the first to fourth embodiments. The states "2" to "5" correspond to the transfer period "Tm1", and the states "6" to "9" correspond to the transfer period "Tm2". In each of the transfer periods "Tm1", "Tm2", the polarities of the accumulation voltage and the holding voltage are switched. In this regard, the state ("3", "8") of the reference potential temporarily exists between the both polarities. In the state ("3", "8") where the accumulation voltage and the holding voltage become the reference potential, potential wells are formed as the evacuation regions at the regions corresponding to the control electrodes (24a, 24b, 25a, 25b), and a potential gradient is given to the main function layer 11 such that electrons or holes are transferred from the accumulation regions 11b corresponding to the accumulation electrodes (12a, 12b) to the evacuation regions corresponding to the control electrodes (25b, 25a), respectively, and the electrons or holes are transferred from the holding regions 11c corresponding to the holding electrodes (13a, 13b) to the evacuation regions corresponding to the control electrodes (24a, 24b), respectively. Since the carriers existing in the accumulation region 11b are different from the carriers existing in the holding region 11c (when one is electrons, the other is holes), the electrons and holes can be recombined by transferring the electrons or holes to the evacuation regions. That is, in another embodiments, the recombination of electrons and holes are mainly performed after the polarities of the accumulation voltage and the holding voltage are switched. In the present embodiment, the recombination can be performed at the time of switching the polarities of the accumulation voltage and the holding voltage as well as after the polarities of the accumulation voltage and the holding voltage are switched. That is, since the electrons and holes are transferred once to the evacuation regions when the accumulation voltage and the holding voltage transit the reference potential, the electrons and holes can be recombined during the transferring operation. In FIGS. 14A to 14H, this transferring operation is shown by a portion where arrows intersect. In addition, as in the case of another embodiments, the electrons or holes captured in the surface of the main function layer 11 at the accumulation region 11b and the holding region 11c can be recombined with the electrons and holes moved from the accumulation region 11b and the holding region 11c.

In conclusion, within the transfer period "Tm1", "Tm2", electrons move from one of the accumulation region 11b and the holding region 11c, which holds electrons, toward the evacuation region positioned at an opposite side with respect to a region holding holes. The electrons reaching the evacuation region without being recombined with the holes further move to the region different from the one of the accumulation region 11b and the holding region 11c, which holds electrons, so that they are recombined with the holes remaining in the aforesaid region. Similarly, holes move from one of the accumulation region 11b and the holding region 11c, which holds holes, toward the evacuation region positioned at an opposite side with respect to a region holding electrons. The holes reaching the evacuation region without being recombined with the electrons further move to the region different from the one of the accumulation region 11b and the holding region 11c, which holds holes, so that they are recombined with the electrons remaining in the aforesaid region. According to these operations, when the accumulation voltage and the holding voltage become the reference potential, in other words, the polarities of the accumulation voltage and the holding voltage are switched, the potential gradient is given such that electrons or holes move toward the evacuation region through the accumulation region 11b or the holding region 11c without unwanted diffusion of electrons and holes, and subsequently the electrons or holes are pulled back to the accumulation region 11b or the holding region 11c passed just a short while ago.

The state ("2", "7") in the transfer period ("Tm1", "Tm2") is a preparation period before switching the polarities of the accumulation voltage and the holding voltage. By preparing the evacuation regions at the state "2", "7", it is possible to give the potential gradient to the main function layer 11, and prevent the diffusion of electrons and holes. In FIGS. 14A to 14H, the state ("1", "6") corresponding to the accumulation period ("Tc1", "Tc2") in the ten states "1" to "10" are set to be longer in time than the other states to collect larger amounts of electrons and holes in the accumulation region 11b. In addition, the states "1" to "5" are different from the states "6" to "10" only by reversing the states concerning electrons and holes. Therefore, both are based on the same principle.

Thus, according to the present embodiment, when the accumulation voltage and the holding voltage becomes the reference potential (the state "3", "8"), the potential gradient is generated between the two evacuation regions under the condition that adjacent accumulation region 11b and holding region 11c are positioned between the two evacuation regions, in order to prevent the diffusion of electrons and holes. Therefore, it is possible to prevent a situation that electrons and holes are mixed between adjacent photoelectric converting portions 1, and improve the separation property of the photoelectric converting portion 1. Moreover, in the present configuration, the control electrodes (24a, 24b, 25a, 25b) as well as the accumulation electrodes (12a, 12b) and the holding electrodes (13a, 13b) can be used for electron transfer when taking out the electrons remaining after the recombination process as the received light output. Other configurations and operations are the same as the other embodiments.

As clearly understood from the operations shown in FIGS. 14A to 14H, the eight electrodes constructing one pixel are provided with a combination of the accumulation electrode 12a, the holding electrode 13a, and the control electrodes (24a, 25a), and a combination of the accumulation electrode 12b, the holding electrode 13b, and the control electrodes (24b, 25b). Since electrons and holes move among the four electrodes in each of the combinations, there is no leakage of electrons and holes to the outside of the respective combination. Therefore, it is possible to prevent that electrons and holes are mixed from one of the combinations into the other combination. The above explanation about the voltage control is merely an example. Another operations are available on the condition that electrons and holes are transferred to the evacuation regions at the time of switching the accumulation voltage and the holding voltage, and then transferred from the evacuation regions to the accumulation region 11b and the holding region 11c. In addition, the above explanation is based on the case where two pairs of control electrodes (24a, 24b, 25a, 25b) are used with respect to a pair of the accumulation electrodes (12a, 12b) and a pair of the holding electrode (13a, 13b). Alternatively, only two control electrodes may be used with respect to the accumulation electrodes (12a, 12b) and the holding electrodes (13a, 13b). That is, even when using the same configuration as the third embodiment with two transfer electrodes 22, 23, the voltages can be controlled such that electrons and holes are transferred to the evacuation regions at the time of switching the accumulation voltage and the holding voltage.

SIXTH EMBODIMENT

Figure 15:
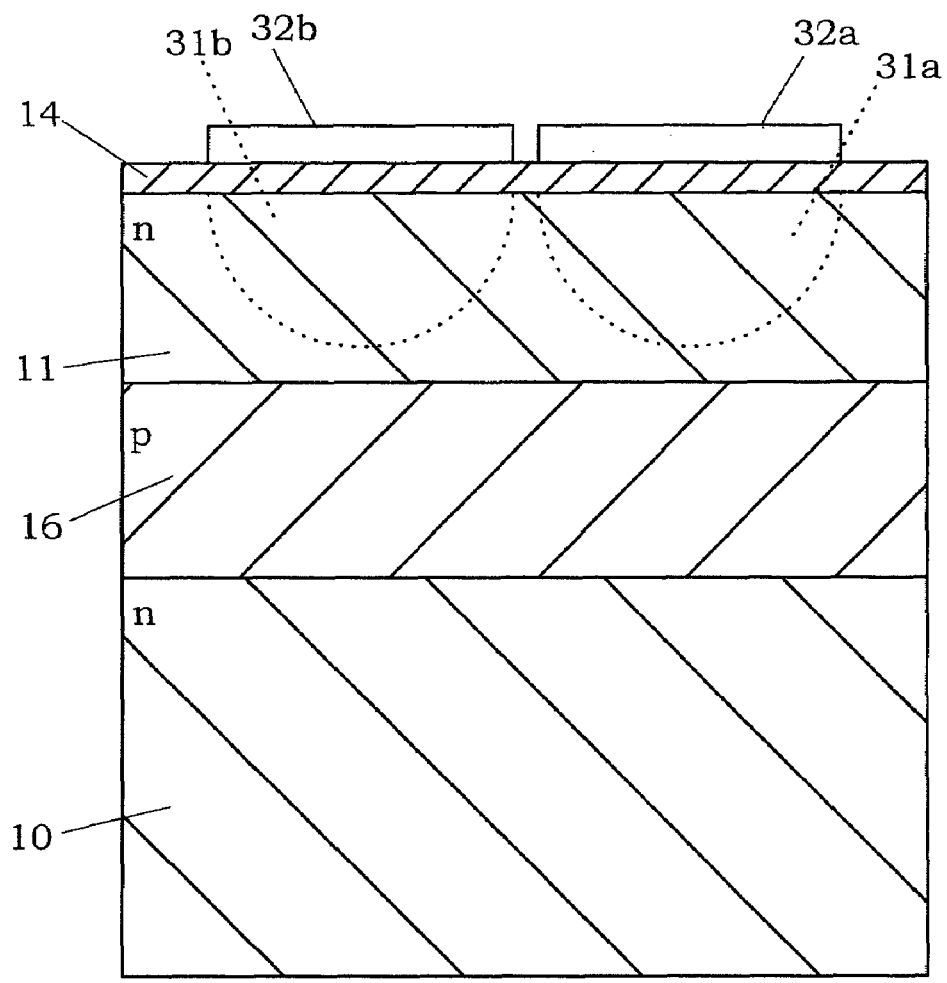
FIG. 15 is a schematic cross-sectional view of a photodetector according to a sixth embodiment of the present invention.

In a photodetector of this embodiment, as shown in FIG. 15, a main function layer 11 of an n-type silicon layer is formed on a substrate 10 of an n-type silicon layer through an intermediate layer 16 of a p-type silicon layer, and an insulating layer 14 of a silicon oxide film is formed on the main function layer 11. In addition, a plurality of distribution electrodes 32a, 32b are formed in a facing manner on the general surface of the main function layer 11 through the insulating layer 14. That is, the two distribution electrodes 32a, 32b are disposed adjacent to each other. Therefore, one photoelectric converting portion 1 has a pair of the distribution electrodes 32a, 32b. The substrate 10, the main function layer 11, the insulating layer 14, and the intermediate layer 16 of one photoelectric converting portion 1 are shared with the other photoelectric converting portions 1.

When distribution voltages are applied to the distribution electrodes (32a, 32b), potential wells (31a, 31b) are formed in the main function layer 11. In addition, the distribution electrodes (32a, 32b), and the insulating layer 14 have translucency. Therefore, light can reach the main function layer 11 through the distribution electrodes (32a, 32b).

When light is incident on the photoelectric converting portion 1, electrons and holes are generated. When appropriate voltages are applied to the distribution electrodes (32a, 32b), the electrons and holes generated in the photoelectric converting portions 1 are accumulated in the potential wells (31a, 31b), which are formed at regions corresponding to the distribution electrodes (32a, 32b) in the main function layer 11. In this regard, a distance between the distribution electrodes (32a, 32b) in one group, and magnitudes of the distribution voltages are set such that electrons and holes can be moved between the potential wells (31a, 31b).

To obtain a received light output corresponding to amounts of light incident on the photoelectric converting portion 1, a substrate voltage applied to the substrate 10 and a reset voltage applied to the intermediate layer 16 in the period of generating electrons and holes in the photoelectric converting portion 1 are the same as the first embodiment, and therefore duplicate explanations are omitted.

Each of the distribution voltages applied to the distribution electrodes (32a, 32b) can be switched in two stages between positive and negative values. When each of the distribution voltages is the positive value, it is possible to collect electrons in the potential wells (31a, 31b). When each of the distribution voltages is the negative value, it is possible to collect holes in the potential wells (31a, 31b). In the present embodiment, at least one of the carriers (electrons and holes) generated in the photoelectric converting portion 1 are used as the received light output.

Next, when the distribution voltage applied to the distribution electrode 32a is the positive value, and the distribution voltage applied to the distribution electrode 32b is the negative value, electrons are accumulated in the potential well 31a corresponding to the discharge electrode 32a, and holes are accumulated in the potential well 31b corresponding to the discharge electrode 32b. That is, the electrons and holes generated at the same time in the photoelectric converting portion 1 are separately accumulated in the potential wells (31a, 31b).

After electrons are accumulated in the potential well 31a, and holes are accumulated in the potential well 31b, the polarity of the distribution voltage applied to each of the distribution electrodes (32a, 32b) is switched, so that the electrons are transferred to the potential well 31b, and the holes are transferred to the potential well 31a. At this time, the transferred electrons and holes are recombined with the electrons and holes captured by dangling bonds (or an interfacial potential) of the respective potential wells (31a, 31b). In addition, the electrons and holes are recombined in process of transferring to the respective potential wells. Therefore, the number of the electrons and holes remaining in the potential wells (31a, 31b) after transferring is smaller than the number of the electrons and holes accumulated in the potential wells (31a, 31b) before transferring. In this regard, since light shielding is not performed, the electrons and holes generated in the main function layer 11 are also accumulated in the potential wells (31a, 31b) in the process of transferring the electrons and holes to the potential wells.

After transferring the electrons and holes are performed plural times, desired carriers, i.e., one of electrons and holes are taken out as the received light output. At this time, the number of the carriers becomes smaller than the case of simply outputting the accumulated carriers. As a result, saturation becomes hard to occur in the photoelectric converting portion 1. In addition, the recombination probability of electrons and holes usually depends on densities of electrons and holes, and as the densities increase, the recombination probability becomes higher. Therefore, when the densities are low due to a reduction in received light amount, the recombination is hard to occur, and a ratio of the remaining electrons and holes relative to the electrons and holes generated in the main function layer 11 and so on increases. On the contrary, when the densities are high due to an increase in received light amount, the recombination becomes easy to occur, and the ratio of the remaining electrons and holes relative to the electrons and holes generated in the main function layer 11 and so on reduces. That is, since the dynamic range of the received light output is suppressed relative to the dynamic range of the received light amount, an advantage that saturation becomes hard to occur in the photoelectric converting portion 1 is expected. In addition, since a shot noise caused by a difference in received light amount is suppressed, it is possible to shorten integration time (light receiving time) by a reduction in the influence of shot noise, and improve response speed, as compared with the case where the received light output is taken out without the recombination process.

Next, basic operations of the photoelectric converting portion 1 are explained. Electrons and holes simultaneously generated in the photoelectric converting portion 1 depending on the amounts of light incident on the photoelectric converting portion 1 are separately accumulated in the two potential wells (31a, 31b). After the accumulated electrons and holes are recombined, at least one of remaining electrons and holes not recombined are taken out as the received light output. In this regard, when electrons and holes exist in the photoelectric converting portion 1 before an intended light is incident on the photoelectric converting portion 1, unwanted components are included in the received light output taken out from the photoelectric converting portion 1. This means that the received light output obtained from the photoelectric converting portion 1 does not correspond to the light amount received by the photoelectric converting portion 1. Therefore, unwanted electrons and holes existing in the photoelectric converting portion 1 are firstly discarded before intended electrons and holes are accumulated in the potential wells (31a, 31b). This charge discarding treatment can be performed as in the case of the first embodiment, and therefore duplicate explanations are omitted.

After the photoelectric converting portion 1 is reset, a positive distribution voltage is applied to the distribution electrode 32a to accumulate electrons in the potential well 31a, and at the same time a negative distribution voltage is applied to the distribution electrode 32b to accumulate holes in the potential well 31b. By irradiation of light, electrons and holes are generated in the photoelectric converting portion 1. In this case, since the distribution voltage applied to the distribution electrode 32a is the positive value, and the distribution voltage applied to the distribution electrode 32b is the negative value, a potential gradient occurs from the potential well 31a toward the intermediate layer 16 in the main function layer 11, and at the same time a potential gradient occurs from the intermediate layer 16 toward the potential well 31b in the main function layer 11. Therefore, the electrons generated in the photoelectric converting portion 1 are accumulated in the potential well 31a, and the holes generated in the photoelectric converting portion 1 are accumulated in the potential well 31b. In addition, at this time, the potential gradient occurs from the potential well 31a toward the potential well 31b. When holes exist in the potential well 31a, they are transferred to the potential well 31b. When electrons exist in the potential well 31b, they are transferred to the potential well 31a.

After electrons are accumulated in the potential well 31a, the distribution voltage applied to the distribution electrode 32a is set to a negative value, and the distribution voltage applied to the distribution electrode 32b is set to a positive value under the condition that the rest voltage is kept at the ground potential. At this time, a potential gradient occurs from the intermediate layer 16 toward the potential well 31a in the main function layer 11, and at the same time a potential gradient occurs from the potential well 31b toward the intermediate layer 16 in the main function layer 11. That is, the electrons generated in the photoelectric converting portion 1 are accumulated in the potential well 31b, and the holes generated in the photoelectric converting portion 1 are accumulated in the potential well 31a. In addition, as this time, since the potential gradient occurs from the potential well 31b toward the potential well 31a, the electrons accumulated in the potential well 31a are transferred to the potential well 31b, and the holes accumulated in the potential well 31b are transferred to the potential well 31a. In this regard, since some of the electrons are captured by dangling bonds or an interfacial potential at a surface portion of the potential well 31a, they can not be transferred. Similarly, since some of the holes are captured by dangling bonds or an interfacial potential at a surface portion of the potential well 31b, they can not be transferred. These electrons and holes not transferred are recombined with the electrons and holes accumulated in the potential wells (31a, 31b) or the electrons and holes transferred to the potential wells (31a, 31b). In addition, since the electrons and holes are moved in opposite directions to each other with high densities in the process of transferring them between the potential wells (31a, 31b), the recombination probability of electrons and holes becomes higher. As a result, parts of the electrons and holes are offset by the recombination in the process of transferring.

Subsequently, when the polarity of the distribution voltage applied to each of the distribution electrodes (32a, 32b) is switched (i.e., the distribution voltage applied to the distribution electrodes 32a is set to the positive value, and the distribution voltage applied to the distribution electrodes 32b is set to the negative value), the reset state is revived. At this time, a potential gradient occurs from the potential well 31a toward the intermediate layer 16 in the main function layer 11, and at the same time a potential gradient occurs from the intermediate layer 16 toward the potential well 31b in the main function layer 11. As a result, the potential gradient occurs from the potential well 31a toward the potential well 31b. In this case, the electrons generated in the photoelectric converting portion 1 are accumulated in the potential well 31a, and the holes generated in the photoelectric converting portion 1 are accumulated in the potential well 31b. In addition, the holes accumulated in the potential well 31a are transferred to the potential well 31b, and the electrons accumulated in the potential well 31b are transferred to the potential well 31a. Moreover, the electrons and holes captured in the potential wells (31a, 31b) can be recombined with the electrons and holes accumulated in the potential wells (31a, 31b) or the electrons and holes transferred to the potential wells (31a, 31b). Furthermore, some of the electrons and holes are offset by the recombination in the process of transferring.

Even when switching the polarity of the distribution electrode applied to each of the distribution electrodes (32a, 32b) once, parts of the electrons and holes generated in the photoelectric converting portion 1 can be offset. On the other hand, when the number of the holes accumulated at a time in the potential well (31a, 31b) decreases (i.e., the accumulation period is shortened), saturation of the photoelectric converting portion 1 becomes hard to occur. Therefore, it is desired to shorten the accumulation period, and perform the operation of switching the polarity of the distribution voltage plural times. In addition, when switching the polarity of the distribution voltage only one time, the probability that the electrons meet up with the holes is low due to low densities of electrons and holes. By switching the polarity of the distribution voltage plural times, it is possible to increase the densities of electrons and holes, and elevate the recombination probability.

By the way, to take out the electrons not recombined remaining in the potential well 31b from the photoelectric converting portion 1 after electrons are recombined with holes according to the above-described operations, the potential wells (31a, 31b) formed in the main function layer 11 are controlled by regulating the voltages applied to the distribution electrodes (32a, 32b), so that the electrons held in the potential well 31b are transferred. That is, by using the main function layer 11 and the distribution electrodes (32a, 32b), the electrons can be transferred in one of left and right directions in FIG. 1, as in the case of the conventional CCD.

As described above, it is needed to set the light receiving period where amounts of electrons and holes corresponding to the signal light are allowed to remain in the potential wells (31a, 31b) by repeating lighting and extinction of the light emitting source 2 and recombining electrons and holes, and the ejecting period where at least one of the electrons and holes remaining in the potential wells (31a, 31b) are taken out from the photoelectric converting portion 1. The voltage controls for these periods are already explained in the first embodiment, and therefore duplicate explanations are omitted. In the case of using the same configuration as an interline CCD image sensor, two columns of vertical transfer resisters may be used to separately transfer electrons and holes. The carriers held in each of the potential wells (31a, 31b) may be separately transferred to the respective vertical transfer resisters. In this configuration, it is also desired to separately form horizontal transfer resisters for electrons and holes.

In the present embodiment where the voltages with opposite polarities are simultaneously applied to the distribution electrodes (32a, 32b), a transfer electrode may be disposed between the distribution electrodes (32a, 32b), as described in the above embodiment. In this case, there are advantages that by increasing a distance between the distribution electrodes, it becomes easy to separate electrons and holes from each other, and the electrons and holes remaining in the potential wells (31a, 31b) can be easily transferred. In addition, by forming a discarding electrode in the same configuration as FIG. 10, the electrons and holes remaining in the photoelectric converting portion can be discarded. Furthermore, as described above, an insulating separator may be formed at an appropriate portion, or control electrodes may be formed such that the distribution electrodes (32a, 32b) are positioned between the control electrodes In the above embodiments, it was explained about the case where the main function layer 11 is n-type, the intermediate layer 16 is p-type, and the substrate 10 is n-type. However, the conductive types of them may be changed as far as the controls described above are operable. In addition, it was explained about the case where electrons are used as the received light output. However, holes may be used as the received light output. Alternatively, both of electrons and holes can be used as the received light output. In the configuration of FIG. 2, the recombination probability is in fact not 1. After the accumulation electrode and the holding electrode are controlled to recombine electrons and holes, both of electrons and holes remain, but not only one of electrons and holes remain.

For example, when electrons are mainly accumulated in the accumulation region 11b in the lighting period "Pb", and holes are mainly accumulated in the accumulation region 11b in the extinction period "Pd", it is thought that the number of electrons corresponding to the received light amount in the lighting period "Pb" and the number of holes corresponding to the received light amount in the extinction period "Pd" are evenly offset by the recombination. In addition, when the number of the electrons accumulated in the lighting period "Pb" is "Ne", the number of the holes accumulated in the extinction period "Pd" is "Nh", and the number of electrons or holes offset by a single recombination step is "Nd", the number of the electrons and holes remaining after the single recombination step is represented by (Ne-Nd) or (Nh-Nd). Therefore, by using either electrons or holes as the received light output, it is possible to suppress the saturation of the photodetector 6, as compared with the case of using them without the recombination.

In addition, when the period of accumulating electrons is the period corresponding to the received light amount (A0 or A1) shown in FIGS. 4 and 5, and the period of accumulating holes is the period corresponding to the received light amount (A2 or A3), the number of the electrons remaining after the recombination process can be determined by subtracting a certain number "ND" proportional to "Nd" from the number "NE" corresponding to the received light amount (A0 or A1), and similarly the number of the holes remaining after the recombination process can be determined by subtracting the certain number "ND" proportional to "Nd" from the number "NH" corresponding to the received light amount (A2 or A3). That is, when the electrons and holes remaining after the recombination process are taken out as the received light outputs, and then subtractions are performed, (NE-ND)-(NH-ND) are obtained. Since (NE-ND)-(NH-ND)=NE-NH, it is possible to determine A0-A2 or A1-A3. This operation is based on an assumption that the accumulation efficiencies of electrons and holes are equal to each other. Therefore, when the accumulation efficiencies are different, an appropriate compensation for the operation is needed. In addition, since electron is different in polarity from hole, the polarity of the received light output corresponding to electrons or holes in the output of the photodetector 6 is inverted, or two received light outputs obtained from the photodetector 6 are added in an external circuit (e.g., the distance operating circuit 5) for performing the operation of (A0-A2) or (A1-A3).

INDUSTRIAL APPLICABILITY

As understood from the above embodiments, according to the present invention, it is possible to prevent that the received light output is saturated by the environmental light, and suppress a reduction in dynamic range for the signal light. Therefore, the signal light can be detected even under a stronger environmental-light condition than before. Specifically, a spatial information detecting device can be provided, which has the capability of stably detecting information of an outdoor target space with high accuracy. Thus, the present invention is expected to be widely utilized in applications including crime-prevention system.

The invention claimed is:

1. A photodetector comprising:
  a photoelectric converting portion configured to generate electrons and holes by irradiation of light;
  at least one electrode disposed on said photoelectric converting portion through an insulating layer;
  a first accumulation region, which is a potential well formed in said photoelectric converting portion by applying a voltage to said electrode to accumulate one of the electrons and holes generated in said photoelectric converting portion by irradiation of light;
  a second accumulation region formed in said photoelectric converting portion to accumulate the other of the electrons and holes generated in said photoelectric converting portion by irradiation of light;
  a control unit configured to control at least one of a timing of applying said voltage to said electrode and a polarity of said voltage; and
  an output unit configured to output at least one of remaining electrons and holes not recombined after the electrons and holes accumulated in the first and second accumulation regions are recombined by transferring the electrons and holes between the first and second accumulation regions.

2. The photodetector as set forth in claim 1, wherein said at least one electrode is a pair of first and second electrodes disposed on said photoelectric converting portion through said insulating layer, and said control unit applies a voltage to the first electrode to form the first accumulation region, and applies a voltage to the second electrode to form a potential well as the second accumulation region.

3. The photodetector as set forth in claim 2, wherein said control unit controls timings of applying said voltages to the first and second electrodes and polarities of said voltages such that one of the electrons and holes generated in said photoelectric converting portion by irradiation of light are accumulated in the first accumulation region, and the other of the electrons and holes generated at a different time in said photoelectric converting portion by irradiation of light are accumulated in the second accumulation region.

4. The photodetector as set forth in claim 2, wherein said control unit applies voltages with opposite polarities to the first and second electrodes such that one of the electrons and holes generated in said photoelectric converting portion by irradiation of light are accumulated in the first accumulation region, and simultaneously the other of the electrons and holes are accumulated in the second accumulation region.

5. The photodetector as set forth in claim 2, wherein said control unit switches between a state of applying said voltages to the first and second electrodes such that electrons are accumulated in the first accumulation region, and holes are accumulated in the second accumulation region, and a state of applying said voltages to the first and second electrodes such that holes are accumulated in the first accumulation region, and electrons are accumulated in the second accumulation region, so that the electrons and holes are recombined between the first accumulation region and the second accumulation region.

6. The photodetector as set forth in claim 2, comprising a light shielding film on the second electrode, wherein said control unit controls timings of applying said voltages to the first and second electrodes and polarities of said voltages such that after one of electrons and holes are accumulated in the first accumulation region, they are transferred and held in the second accumulation region, and the other of electrons and holes are accumulated in the first accumulation region.

7. The photodetector as set forth in claim 2, comprising a lens for allowing an incident light to converge on the first electrode.

8. The photodetector as set forth in claim 2, wherein the first electrode is provided by a pair of first electrodes, the second electrode is provided by a pair of second electrodes, and the first electrodes are placed between the second electrodes.

9. The photodetector as set forth in claim 8, wherein a distance between the first electrodes is greater than the distance between one of the first electrodes and the second electrode adjacent thereto.

10. The photodetector as set forth in claim 2, wherein the first electrode is provided by a pair of first electrodes,
  the second electrode is provided by a pair of second electrodes,
  transfer electrodes are formed on said photoelectric converting portion through said insulating layer between the first electrodes and between the second electrodes, and
  said control unit controls voltages applied to the first electrodes, the second electrodes, and the transfer electrodes such that at least one of the remaining electrons and holes are transferred to the said output unit.

11. The photodetector as set forth in claim 8, comprising a charge discarding electrode formed on a surface of said photoelectric converting portion so as to extend away from each of the first and second electrodes by a substantially equal distance and in a direction orthogonal to each of longitudinal directions of the first and second electrodes, wherein said control unit controls a voltage applied to said charge discarding electrode to discard electrons and holes from said photoelectric converting portion.

12. The photodetector as set forth in claim 2, wherein
  the first electrode is provided by a pair of first electrodes,
  the second electrode is provided by a pair of second electrodes,
  at least one control electrode is formed on said photoelectric converting portion through said insulating layer between the first electrodes and/or between the second electrodes, and
  said control unit applies a voltage to said control electrode to form an evacuation region of a potential well, so that electrons and holes are transferred between the first accumulation region and the second accumulation region via the evacuation region.

13. The photodetector as set forth in claim 12, wherein said control unit controls voltages applied to the first electrodes, the second electrodes and the control electrode such that a potential gradient occurs in a certain direction among the first accumulation region, the second accumulation region and the evacuation region.

14. The photodetector as set forth in claim 2, comprising a control electrode, wherein the second electrode is placed between the first electrode and the control electrode, and said control unit applies a voltage to the control electrode to form an evacuation region of a potential well, so that one of the electrons and holes accumulated in the first accumulation region are transferred to the second accumulation region via said evacuation region.

15. The photodetector as set forth in claim 1, wherein said photoelectric converting portion is provided with a substrate, an intermediate layer formed on said substrate, and a main function layer formed on said intermediate layer, said control unit controls a polarity of a reset voltage such that the rest voltage applied to said intermediate layer is a reverse bias with respect to a substrate voltage applied to said substrate, in order to discard electrons and holes remaining in said photoelectric converting portion via one of said substrate and said intermediate layer.

16. A spatial information detecting device using the photodetector as set forth in claim 2, said device comprising:
a light projecting unit configured to irradiate a light intensity-modulated by a modulation signal having a predetermined frequency to a target space;
the photodetector, said photoelectric converting portion of the photodetector generating electrons and holes by receiving the light from said target space, said control unit of the photodetector switching between a state of applying voltages to the first and second electrodes such that electrons are accumulated in the first accumulation region, and holes are accumulated in the second accumulation region, and a state of applying voltages to the first and second electrodes such that holes are accumulated in the first accumulation region, and electrons are accumulated in the second accumulation region, thereby recombining the electrons and holes between the first and second accumulation regions, and said output unit outputting at least one of remaining electrons and holes not recombined; and
an evaluation unit configured to evaluate said target space according to an output of the photodetector.

17. The spatial information detecting device as set forth in claim 16, wherein said control unit alternately switches every 180 degrees in phase of said modification signal between the state of applying said voltages to the first and second electrodes such that electrons are accumulated in the first accumulation region, and holes are accumulated in the second accumulation region, and the state of applying said voltages to the first and second electrodes such that holes are accumulated in the first accumulation region, and electrons are accumulated in the second accumulation region, thereby recombining the electrons and holes between the first and second accumulation regions, and
said evaluation unit determines a difference between an output provided by one of electrons and holes remaining in the first accumulation region after the recombination and an output provided by the other of electrons and holes remaining in the second accumulation region after the recombination with respect to each of two sections, which are different in phase of said modulation signal, and then evaluate said target space from the differences determined with respect to said two sections.

18. The spatial information detecting device as set forth in claim 17, wherein said evaluation unit comprises a distance operating unit configured to convert a value, which is obtained by dividing the difference determined in one of said two sections by the difference determined in the other section, into a distance.

19. A photodetector comprising:
a photoelectric converting portion configured to generate electrons and holes by irradiation of light;
an electrode disposed on said photoelectric converting portion through an insulating layer;
a charge accumulation region that is a potential well formed in said photoelectric converting portion by applying a voltage to said electrode;
a control unit configured to control a timing of applying said voltage to said electrode and a polarity of said voltage such that one of the electrons and holes generated in said photoelectric converting portion by irradiation of light are held at an interface portion between said photoelectric converting portion and said insulating layer in said charge accumulation region, and then the other of the electrons and holes generated in said photoelectric converting portion by irradiation of light are accumulated in said charge accumulation region, thereby recombining the electrons and holes at the interface portion; and
an output unit configured to output at least one of remaining electrons and holes not recombined after the recombination.

20. A photodetection method comprising the steps of:
preparing a photodetection device comprising a photoelectric converting portion configured to generate electrons and holes by irradiation of light, and a pair of electrodes formed on said photoelectric converting portion through an insulating layer;
accumulating at least one of the electrons and holes generated in said photoelectric converting portion by irradiation of light in a first accumulation region, which is a potential well formed in said photoelectric converting portion by applying a voltage to one of said electrodes;
accumulating the other of the electrons and holes generated in said photoelectric converting portion by irradiation of light in a second accumulation region, which is a potential well formed in said photoelectric converting portion by applying a voltage to the other electrode;
controlling timings of applying said voltages to said electrodes and polarities of said voltages such that the electrons and holes are transferred between the first and second accumulation regions to recombine the electrons and holes accumulated in the first and second accumulation regions, and then outputting at least one of remaining electrons and holes not recombined.

* * * * *